(12) United States Patent
Ishikawa et al.

(10) Patent No.: US 11,543,705 B2
(45) Date of Patent: Jan. 3, 2023

(54) SUBSTRATE HAVING COLOR FILTER

(71) Applicant: Japan Display Inc., Tokyo (JP)

(72) Inventors: Tomokazu Ishikawa, Tokyo (JP); Masaru Nakakomi, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 109 days.

(21) Appl. No.: 17/099,780

(22) Filed: Nov. 17, 2020

(65) Prior Publication Data

US 2021/0072576 A1 Mar. 11, 2021

Related U.S. Application Data

(63) Continuation of application No. 16/552,259, filed on Aug. 27, 2019, now Pat. No. 10,859,878.

(30) Foreign Application Priority Data

Aug. 27, 2018 (JP) .............................. JP2018-158448

(51) Int. Cl.
| | | |
|---|---|---|
| *H01L 27/00* | (2006.01) | |
| *H01L 29/00* | (2006.01) | |
| *G02F 1/1339* | (2006.01) | |
| *G02F 1/1337* | (2006.01) | |

(Continued)

(52) U.S. Cl.
CPC ...... *G02F 1/1339* (2013.01); *G02F 1/133711* (2013.01); *H01L 27/322* (2013.01); *H01L 29/4908* (2013.01)

(58) Field of Classification Search
CPC ................ H01L 27/322; H01L 27/323; H01L 27/3276; H01L 27/14627; H01L 27/1463; H01L 29/4908; H01L 29/7869; H01L 29/76633; H01L 29/66757; G02F 1/133711; G02F 1/1339; G02F 1/1343;
(Continued)

(56) References Cited

U.S. PATENT DOCUMENTS

| | | | |
|---|---|---|---|
| 8,736,731 B2 * | 5/2014 | Noudo ................ | H01L 27/1464 348/340 |
| 9,530,984 B2 | 12/2016 | Sonoda et al. | |
| 9,709,854 B2 | 7/2017 | Hirota et al. | |

(Continued)

FOREIGN PATENT DOCUMENTS

| | | |
|---|---|---|
| JP | 2015-225227 A | 12/2015 |
| JP | 2017-116658 A | 6/2017 |

OTHER PUBLICATIONS

Office Action dated May 10, 2022 in Japanese Patent Application No. 2018-158448, 6 pages. (Submitting English Translation only).

*Primary Examiner* — Nikolay K Yushin
(74) *Attorney, Agent, or Firm* — Xsensus LLP

(57) ABSTRACT

According to one embodiment, a display device comprises a first substrate, a second substrate opposed to the first substrate and including a first organic film, a first convex portion extending in a first direction, a second convex portion extending in a second direction intersecting the first direction, and a third convex portion aligned with the first convex portion in the second direction and extending in the first direction, and a sealing member located in a second area around a first area in which an image is displayed, wherein the first convex portion, the second convex portion and the third convex portion are located between the first organic film and the sealing member.

10 Claims, 21 Drawing Sheets

(51) Int. Cl.
*H01L 27/32* (2006.01)
*H01L 29/49* (2006.01)

(58) Field of Classification Search
CPC ............. G02F 1/13439; G02F 1/13394; G02F 1/13345
See application file for complete search history.

(56) References Cited

U.S. PATENT DOCUMENTS

| | | |
|---|---|---|
| 2009/0322979 A1 | 12/2009 | Kang et al. |
| 2010/0265449 A1 | 10/2010 | Kira et al. |
| 2012/0242874 A1* | 9/2012 | Noudo ................ H01L 27/1464 |
| | | 348/294 |
| 2015/0029432 A1 | 1/2015 | Ishikawa et al. |
| 2015/0214504 A1 | 7/2015 | Sonoda et al. |
| 2015/0346556 A1 | 12/2015 | Hirota et al. |
| 2016/0011445 A1 | 1/2016 | Chen et al. |
| 2017/0184899 A1 | 6/2017 | Saeki |

* cited by examiner

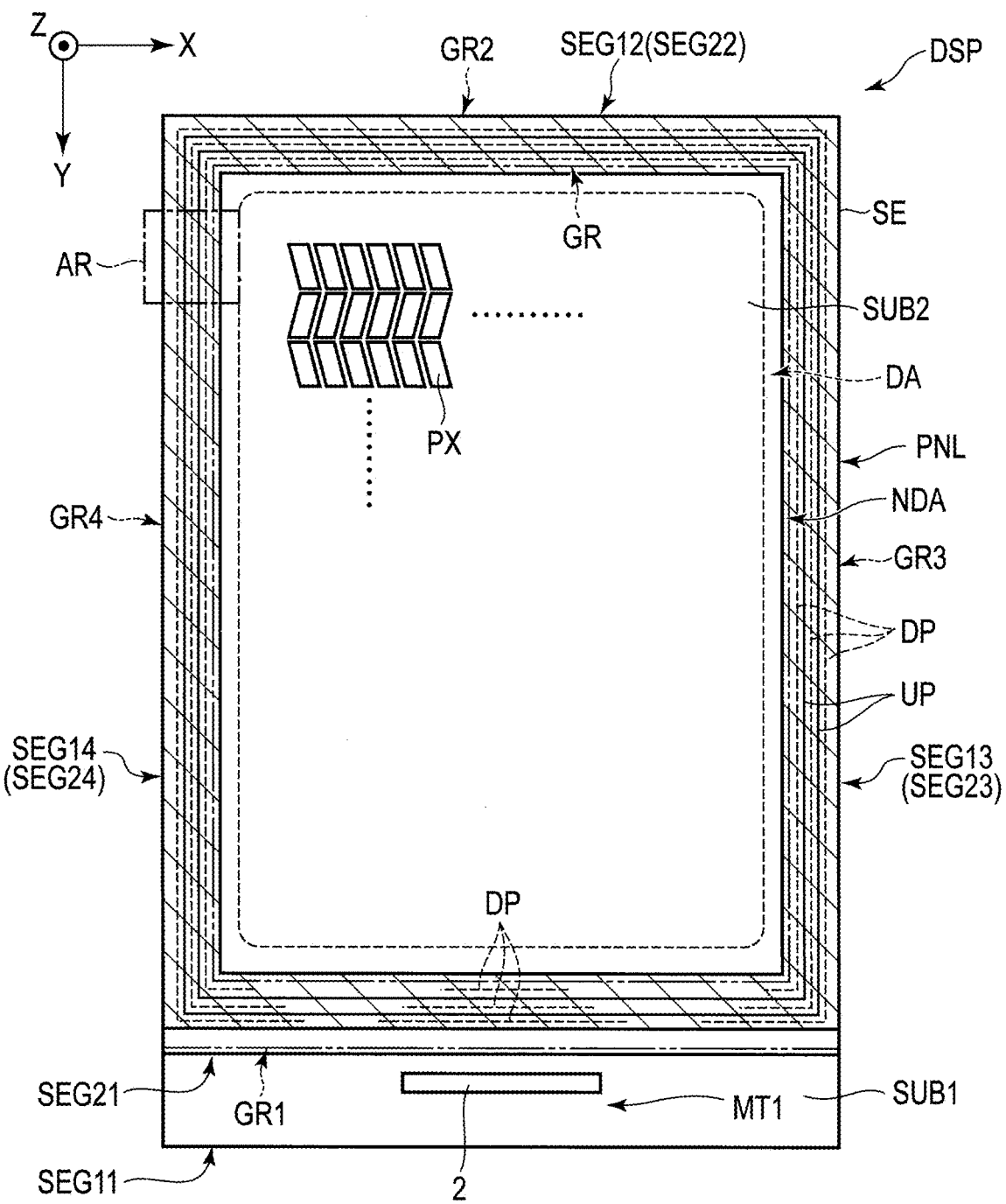
F I G. 1

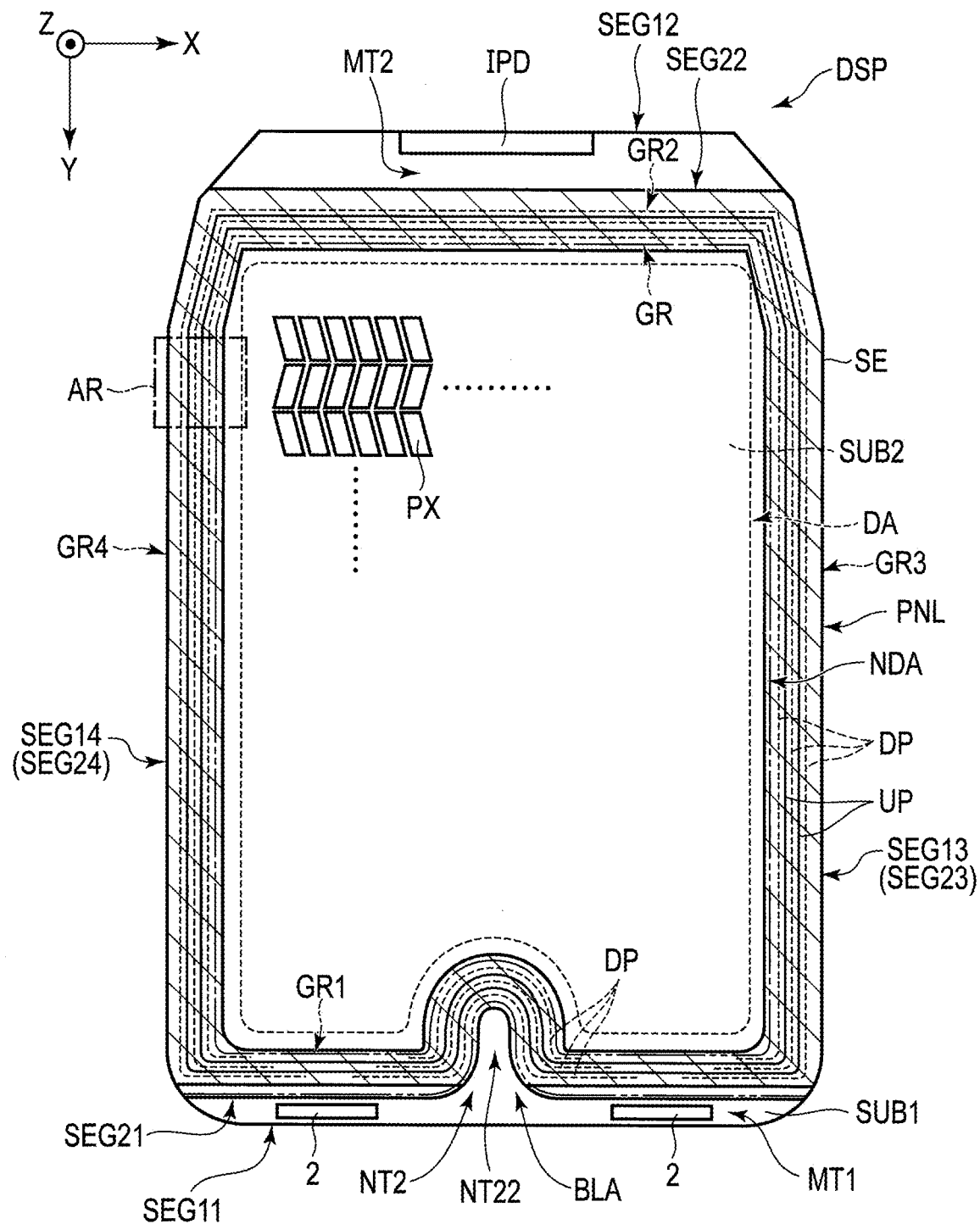
F I G. 3

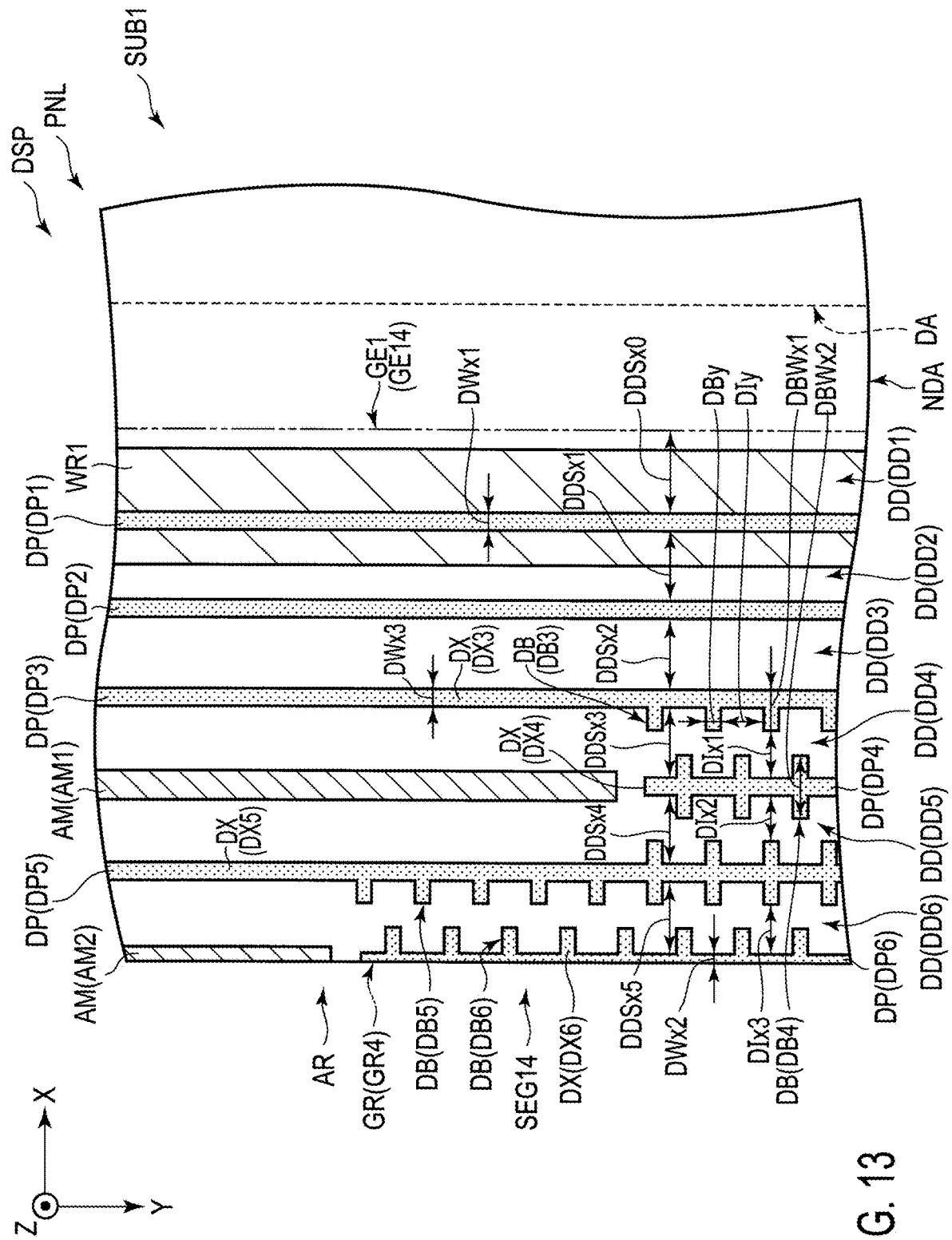
F I G. 13

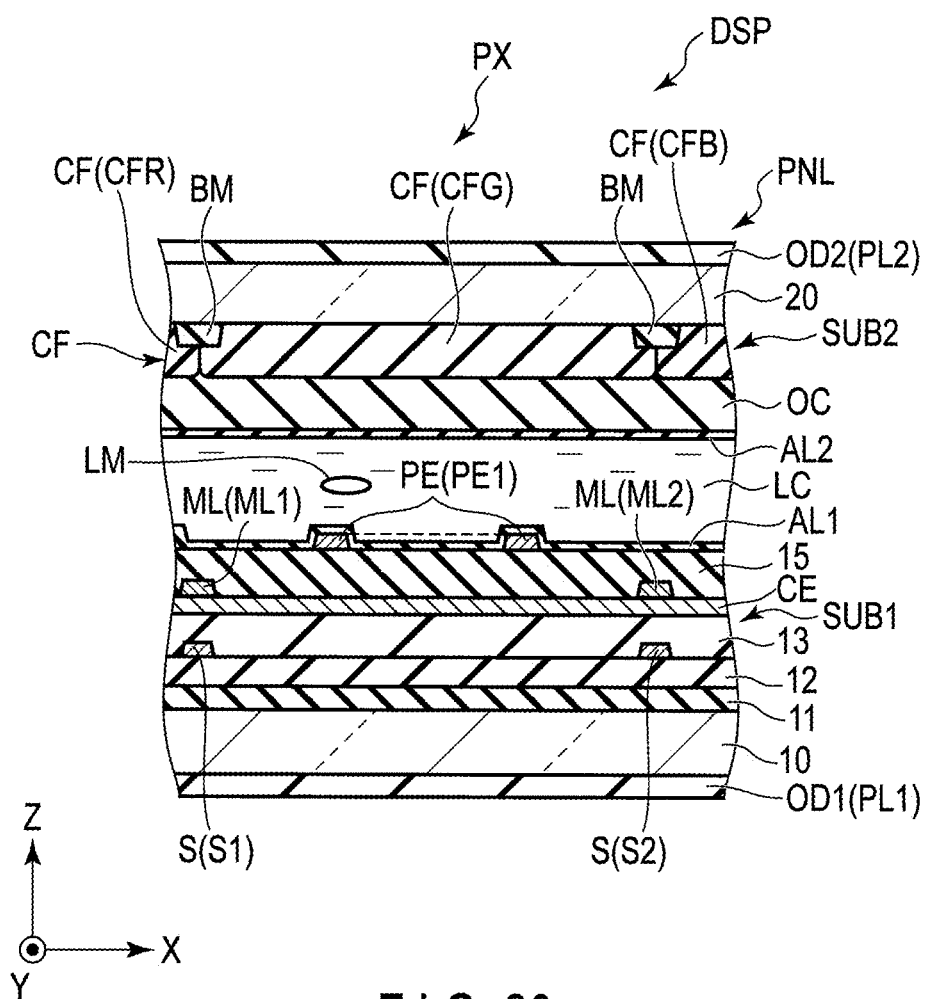
F I G. 20

SUBSTRATE HAVING COLOR FILTER

CROSS-REFERENCE TO RELATED APPLICATIONS

This application is a continuation of U.S. application Ser. No. 16/552,259, filed Aug. 27, 2019, and claims the benefit of priority from Japanese Patent Application No. 2018-158448, filed Aug. 27, 2018, the entire contents of each are incorporated herein by reference.

FIELD

Embodiments described herein relate generally to a display device.

BACKGROUND

Display devices of different types have recently been proposed. A display device includes a display panel formed of a plurality of layers. When an impact or the like is applied to the display panel, a layer whose bonding strength is small is likely to come off from the layers of the display panel.

BRIEF DESCRIPTION OF THE DRAWINGS

FIG. 1 is a plan view showing an example of the appearance of a display device of a first embodiment.

FIG. 3 is a plan view showing an example of the appearance of the display device of a first embodiment.

FIG. 13 is a plan view schematically showing a configuration example of a first substrate according to modification 1 of the first embodiment.

FIG. 20 is a sectional view showing a configuration of part of a display panel according to a second embodiment.

DETAILED DESCRIPTION

Figure 2:
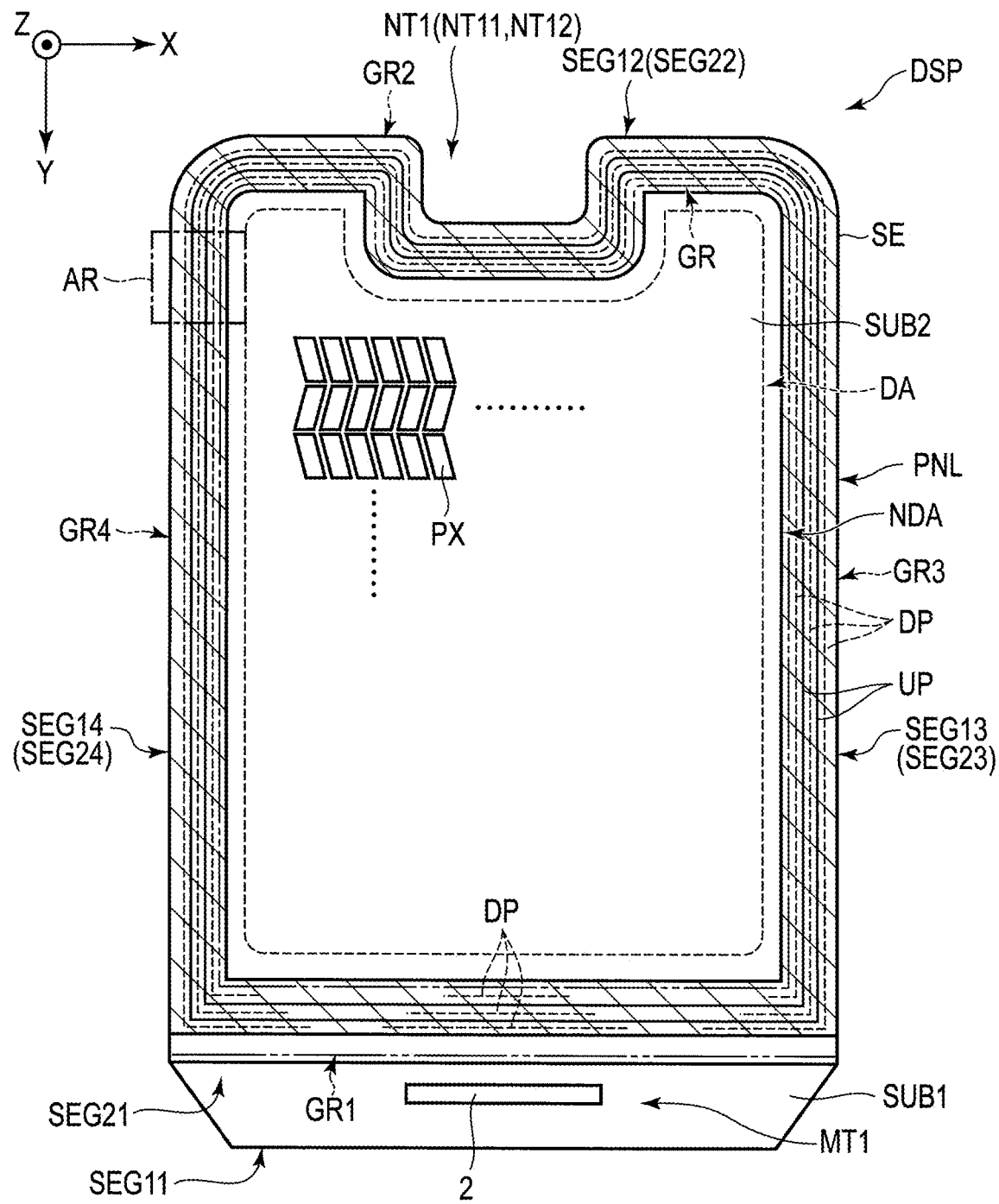
FIG. 2 is a plan view showing an example of the appearance of the display device of a first embodiment.

In general, according to one embodiment, a display device comprises: a first substrate; a second substrate opposed to the first substrate and including a first organic film, a first convex portion extending in a first direction, a second convex portion extending in a second direction intersecting the first direction, and a third convex portion aligned with the first convex portion in the second direction and extending in the first direction; and a sealing member located in a second area around a first area in which an image is displayed to bond the first substrate and the second substrate together, wherein the first convex portion, the second convex portion and the third convex portion are located between the first organic film and the sealing member.

According to another embodiment, a display device comprises: a first substrate including an organic film, a first convex portion including the organic film, a second convex portion aligned with the first convex portion and including the organic film, and a first concave portion located between the first convex portion and the second convex portion; a second substrate opposed to the first substrate and including a third convex portion and a fourth convey portion; and a sealing member located in a second area around a first area in which an image is displayed to bond the first substrate and the second substrate, wherein: the first substrate includes a mounting portion extending outside the second substrate; the first convex portion, the second convex portion and the first concave portion are superposed on the sealing member; and the third convex portion and the fourth convex portion are superposed on the first concave portion.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

Below are descriptions of display devices DSP according to the embodiments. As one example, the display device DSP according to each of the embodiments is a liquid crystal display device.

First, an example of the appearance of the display device DSP accord in to a first embodiment will be described with reference to FIGS. 1 through 3. Note that the appearance of the display device DSP according to the first embodiment is not limited to that shown in FIGS. 1 through 3.

FIG. 1 is a plan view showing an example of the appearance of the display device DSP according to the first embodiment. In FIG. 1, a first direction X, a second direction Y and a third direction Z are orthogonal to each other, but they may intersect at an angle other than 90 degrees. The first direction X and second direction Y each correspond to a direction in which one side of the main surface of a substrate of the display device DSP extends, and the third direction Z corresponds to the thickness direction of the display device DSP. In this specification, a position by the side of the distal end of the arrow indicating the third direction Z is referred to as "up", and a position on an opposite side to the distal end of the arrow is referred to as "down". Such expressions as "a second member on a first member" and "a second member under a first member" covers situations that the second member may be in contact with the first member, and may be spaced from the first member. In addition, it is assumed that an observation position in which the display device DSP is observed is located on the point side of the arrow indicating the third direction Z. The way of viewing the X-Y plane defined by the first and second directions X and Y from the observation position is called a planar view. Hereinafter, the length of the display device DSP in the first direction X may also be referred to as a horizontal width, the length thereof in the second direction Y may also be referred to as a vertical width, and the length thereof in the third direction Z may also be referred to as a thickness.

The display device DSP includes a display panel PNL and an IC chip 2.

In the example illustrated in FIG. 1, the display panel PNL is formed in a substantially rectangular shape in planar view. The display panel PNL includes a first substrate SUB1, a second substrate SUB2 opposed to the first substrate SUB1, a sealing member SE, and a display function layer (corresponding to a liquid crystal layer LC to be described later in the first embodiment) held between the first and second substrates SUB1 and SUB2. The first and second substrates SUB1 and SUB2 are bonded to each other by the sealing member SE with a predetermined gap between them. Space surrounded by the first and second substrates SUB1 and SUB2 and the sealing member SE is filled with the liquid crystal layer LC. The display panel PNL includes an inside display area DA surrounded by the sealing member SE to display an image and a frame-shaped non-display area NDA surrounding the display area DA. The sealing member SE is located in the non-display area NDA. In FIG. 1, the sealing member SE is indicated by downward-sloping hatch lines. In the example shown in FIG. 1, the sealing member SE is formed in a rectangular frame shape. The corners of the display area DA are rounded. The sealing member SE may be formed in a shape other than the rectangular frame shape. The display area DA may be formed in a substantially rectangular shape or a polygonal shape other than the rectangular shape.

The display panel PNL includes a plurality of sub-pixels PX in the display area DA. The sub-pixels are the minimum units that can be controlled individually in response to pixel signals and are present in, for example, an area including switching elements disposed at positions where scanning lines G and signal lines S to be described later intersect. The sub-pixels compose a main pixel. As one example, a sub-pixel corresponding to red, a sub-pixel corresponding to green and a sub-pixel responding to blue compose one main pixel. As another example, a sub-pixel corresponding to red, a sub-pixel corresponding to green, a sub-pixel corresponding to blue and a sub-pixel corresponding to white compose one main pixel. The main pixels correspond to the minimum units of images displayed on the display area DA. The sub-pixels PX are arranged in matrix on the display area DA.

A signal supply source, which is required to drive the display panel PNL such as the IC chip 2, is located in the non-display area NDA. In the example illustrated in FIG. 1, the IC chip 2 is mounted on a mounting portion MT1 of the first substrate SUB1 extending outside one substrate edge (which is also referred to as a substrate end portion) SEG21 of the second substrate SUB2. In other words, the IC chip 2 is superposed on the mounting portion MT1. Note that the embodiment is not limited to the structure in which the IC chip 2 is mounted on the mounting portion MT1, but the IC chip 2 may be provided on a flexible printed circuit (FPC) connected to the mounting portion MT1. The mounting portion MT1 is formed along one substrate edge SEG11 of the first substrate SUB1. Although not illustrated in the figure, the first substrate SUB1 includes a connection terminal (hereinafter referred to as a pad) for connecting the signal supply source to the mounting portion MT1. The pad includes pads electrically connected to the scanning lines G and signal lines S to be described later. In the example shown in FIG. 1, the other three substrate edges SEG22, SEG23 and SEG24 of the second substrate SUB2 are respectively opposed to the other three substrate edges SEG12, SEG13 and of the first substrate SUB1 The IC chip 2 incorporates a display driver that outputs a signal required to display images in an image display. The IC chip 2 also incorporates a touch controller that controls a touch sensing mode for detecting approach or contact of an object to the display device DSP. The touch controller may be incorporated into an IC chip other than the IC chip 2.

The display panel PNL has a groove portion GR in the first substrate SUB1. The groove portion GR is located in the non-display area NDA. In the example illustrated in FIG. 1, the groove portion GR is superposed on the sealing member SE. The groove portion GR is formed in a rectangular frame shape along the substrate edges SEG21 to SEG24 of the second substrate SUB2. The groove portion GR includes a groove portion GPI located alongside the substrate edge SEG11 (SEG21), a groove portion GR2 located alongside the substrate edge SEG12 (SEG22), a groove portion GR3 located alongside the substrate edge SEG13 (SEG23) and a groove portion GR4 located alongside the substrate edge (SEG24).

The display panel PNL has convex portions DP on the first substrate SUB1. The convex portions DP are located in the non-display area FDA. The convex portions DP are superposed on, for example, the sealing member SE and the groove portion GR. In the example shown in FIG. 1, the convex portions DP are disposed around the display area DA along the sealing member SE. Some of the convex portions DP are disposed all around the display area DA, and some of the convex portions DP are divided by the mounting portion MT1. Furthermore, some of the convex portions DP are located only alongside the mounting portion MT1 (substrate edge SEG11). All of the convex portions DP may be disposed all around the display area DA. Some of the convex portions DP may be located only alongside one of the substrate edges SEG12 to SEG14. Furthermore, all of the convex portions DP may be divided halfway around the display area DA.

The display panel PNL has convex portions UP on the second substrate SUB2. The convex portions UP are located in the non-display area NDA. The convex portions UP are superposed on, for example, the sealing member SE and the groove portion GR. In the example shown in FIG. 1, the convex portions UP are disposed around the display area DA along the sealing member SE. The convex portions UP are disposed all around the display area DA. Some of the convex portions UP may be disposed all around the display area DA, and some of the convex portions UP may be divided by the mounting portion MT1. Some of the convex portions UP may be located only alongside one of the substrate edges SEG11 to SEG14. Furthermore, all of the convex portions UP may be divided halfway around the display area DA.

The display panel PNL may be one of a transmissive type with a transmissive display function of displaying an image by causing the first substrate SUB1 to transmit light selectively from behind, a reflective type with a reflective display function of displaying an image by reflecting light selectively from the front of the second substrate SUB2, and a transflective type with the transmissive display function and the reflective display function.

In addition, though the detailed description of the configuration of the display panel PNL will be omitted here, the display panel PNL may have a configuration corresponding to each of a display mode using a lateral electric field along the substrate main surface parallel to the X-Y plane, a display mode using a longitudinal electric field along the normal of the substrate main surface, a display mode using an inclined electric field angled with respect to the substrate main surface, and a display mode using an appropriate combination of the lateral electric field, longitudinal electric field and inclined electric field.

FIG. 2 is a plan view showing an example of the appearance of the display device DSP of the first embodiment. In the example illustrated in FIG. 2, the display panel PNL is formed in a substantially round shape in planar view. The display panel PNL includes a notch NT1. The notch NT1 includes a notch NT11 formed in the first substrate SUB and a notch NT12 formed in the second substrate SUB2. The notch NT11 is superposed on the notch NT12. The notch NT11 is located alongside the substrate edge SEG12 opposed to the substrate edge SEG11 in the second direction Y and recessed toward the substrate edge SEG11. The notch NT12 is located alongside the substrate edge SEG22 side opposed to the substrate edge SEG21 in the second direction Y and recessed toward the substrate edge SEG21. The display area DA is formed in a substantially round shape that is recessed toward the substrate edge SEG11 (SEG21) along the notch NT1. The sealing member SE is disposed around the display area DA along the shape of the display area DA. The sealing member SE is bent alongside the substrate edge SEG12 (SEG22) along the notch NT1. The convex portions DP are disposed around the display area DA along the sealing member SE. The convex portions DP are bent along the notch NT11 alongside the substrate edge SEG12 along the sealing member SE. The convex portions UP are disposed around the display area DA along the sealing member SE. The convex portions UP are bent along the notch NT12 alongside the substrate edge SEG22 along the sealing member SE.

FIG. 3 is a plan view showing an example of the appearance of the display device DSP of the first embodiment. In the example illustrated in FIG. 3, the display panel PNL is formed in a substantially round shape in planar view. The display panel PNL includes a notch NT2. The notch NT2 includes an area BLA or the mounting portion MT1 and a notch 522 formed in the second substrate SUB2 The area BLA is superposed on the notch NT22. The notch NT22 is located alongside the substrate edge SEG21 of second substrate SUB2 and recessed toward the substrate edge SEG22. The IC chip 2 is connected to each of two areas of the mounting portion MT1 located on both sides of the area BLA in the first direction which is superposed on the notch NT22 in the mounting portion MT1. In other words, two IC chips 2 are connected to a plurality of areas of the mounting portion MT1, excluding the area BLA. The IC chips may be connected to one area of the mounting portion MT1, excluding the area BLA. The display area DA is formed in a substantially round shape that is recessed toward the substrate edge SEG12 (SEG22) along the notch NT22. The sealing member SE is disposed around the display area DA along the shape of the display area DA. The sealing member SE is bent alongside the substrate edge SEG11 (SEG22) along the notch NT22. The convex portions DP are disposed around the display area DA along the sealing member SE. The convex portions DP are bent alongside the substrate edge SEG11 along the sealing member SE. The convex portions UP are disposed around the display area DA along the sealing member SE. The convex portions UP are bent alongside the substrate edge SEG21 along the sealing member SE.

In the example illustrated in FIG. 3, the display panel PNL includes a pad IPD for inspecting continuity of lines and the like. The pad IPD is located in the non-display area NDA and mounted on the mounting portion MT2 of the first substrate SUB1 extending outside the substrate edge SEG22 of the second substrate SUB2. The mounting portion MT2 is located opposite to the mounting portion MT1 in the second direction Y. The mounting portion MT2 is formed along the substrate edge SEG12 of the first substrate SUB1.

Figure 4:
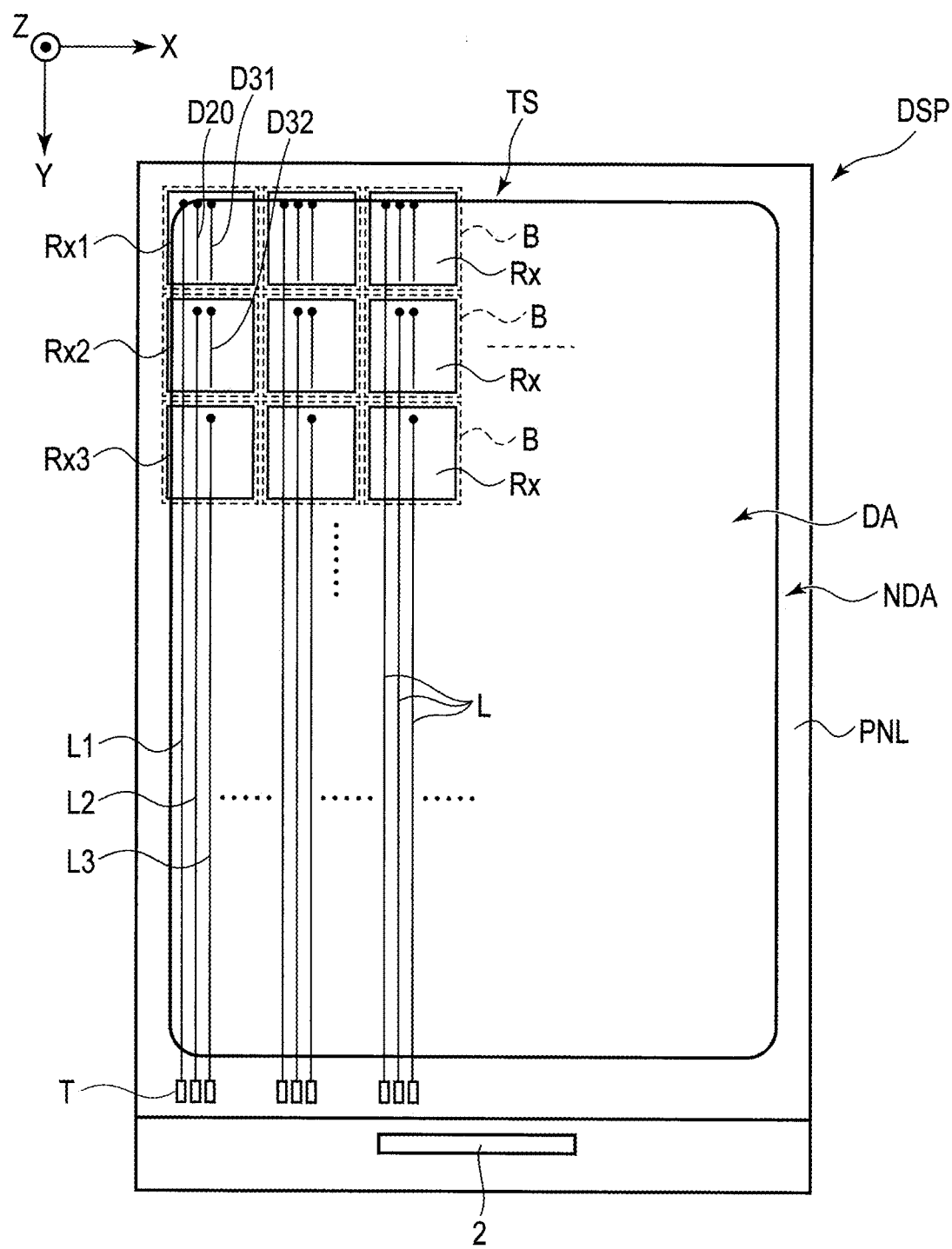
FIG. 4 is a plan view showing a configuration example of a touch sensor according to a first embodiment.

FIG. 4 is a plan view showing a configuration example of a touch sensor TS. Here is a description of a touch sensor TS of a self-capacitive sensing mode. The touch sensor TS may be of a mutual-capacitive sensing mode. In the example shown in FIG. 4, the touch sensor TS is applied to the display panel PNL shown in FIG. 1. It can be applied to the display panel PNL shown in FIGS. 2 and 3.

The touch sensor TS includes a plurality of sensor electrodes (detection electrodes) Rx, (Rx1, Rx2, . . . ) arranged in matrix and a plurality of sensor lines L (L1, L2, . . . ). The sensor electrodes Rx are located in the display area DA and arranged in matrix in the first and second directions X and Y. One sensor electrode Rx corresponds to one sensor block B. The sensor block B is the minimum unit capable of touch sensing. The sensor lines L extend along the second direction Y and are arranged in the first direction X in the display area DA. Each of the sensor lines L is located to be superposed on, for example, a signal line S to be described later. In addition, each of the sensor lines L is drawn into the non-display area NDA and electrically connected to the IC chip 2 or an external circuit such as an FPC substrate. Each of the sensor lines L includes a terminal T in the non-display area NDA.

Here, note the relationship between the sensor lines L1 to L3 arranged in the first direction X and the sensor electrodes Rx1 to Rx3 arranged in the second direction Y. The sensor line L1 is superposed on the sensor electrodes Rx1 to Rx3 and electrically connected to the sensor electrode Rx1.

The sensor line L2 is superposed on the sensor electrodes Rx2 and Rx3 and electrically connected to the sensor electrode Rx2. A dummy line D20 is separated from the sensor line L2. The dummy line D20 is superposed on the sensor electrode Rx1 and electrically connected to the sensor electrode Rx1. The sensor line L2 and the dummy line D20 are located on the same signal line.

The sensor line L3 is superposed on the sensor electrode Rx3 and electrically connected to the sensor electrode Rx3. A dummy line D31 is superposed on the sensor electrode Rx1 and electrically connected to the sensor electrode Rx1.

A dummy line D32 is separated from the dummy line D31 and the sensor line L3. The dummy line D32 is superposed on the sensor electrode Rx2 and electrically connected to the sensor electrode Rx2. The sensor line L3 and the dummy lines D31 and D32 are located on the same signal line.

In the touch sensing mode, the IC chip 2, for example, the touch controller built into the IC chip 2 apples a touch drive voltage to the sensor lines L. Accordingly, the touch drive voltage is applied to the sensor electrode Rx to perform sensing operation in the sensor electrode Rx. A sensor signal corresponding to the sensing result in the sensor electrode Rx is output to the IC chip 2 (touch controller) via the sensor line L. In response to the sensing signal, the IC chip 2 (touch controller) or an external host detects approach or contact of an object to the display device DSP and the position coordinates of the object.

In the display mode, the sensor electrode Rx functions as a common electrode CE to which a common voltage (Vcom) is applied. The common voltage is applied from the IC chip 2, for example, a voltage supply unit included in the display driver built into the IC chip 2, via the sensor line L.

Figure 5:
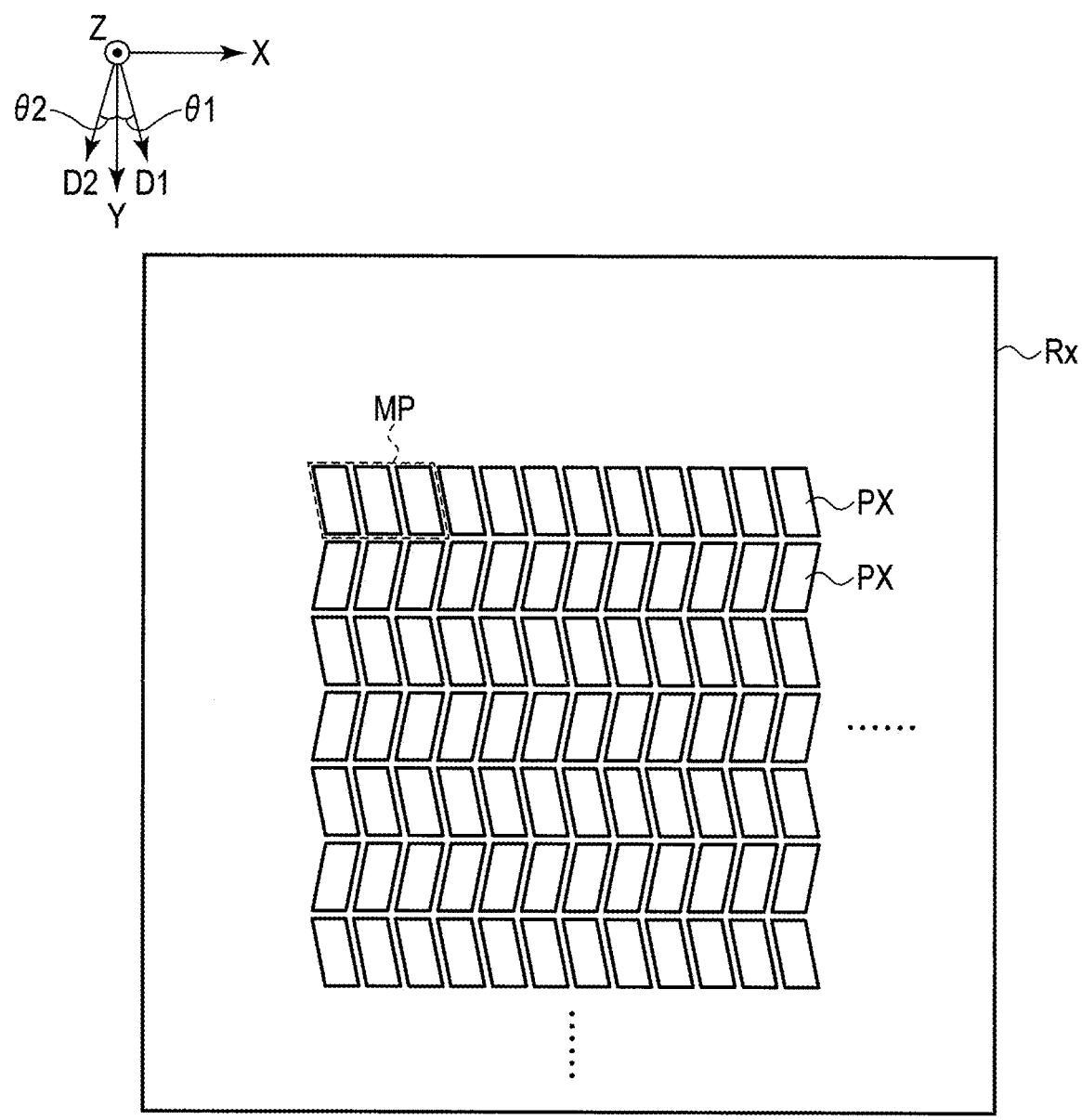
FIG. 5 is a plan view showing an example of a sensor electrode and sub-pixels shown in FIG. 4.

FIG. 5 is a plan view showing the sensor electrode Rx and the sub-pixels PX shown in FIG. 4. In FIG. 5, a direction shifted counterclockwise from the second direction Y by angle θ1 is defined as direction D1, and a direction shifted clockwise from the second direction Y by angle θ2 is defined as direction D2. The angle θ1 between the second direction Y and the direction D1 is substantially the same as the angle θ2 between the second direction Y and the direction D2.

One sensor electrode Rx is disposed all over the sub-pixels PX. In the example illustrated in FIG. 5, the sub-pixels PX located in the odd-numbered lines along the second direction Y extend in the direction. D1. The sub-pixels PX located in the even-numbered lines along the second direction Y extend in the direction D2. For example, 60 to 70 main pixels MP are disposed in one sensor electrode Rx along the first direction X, and 60 to 70 main pixels MP are disposed therein along the second direction Y. The sub-pixels PX need not be arranged as shown in FIG. 5.

Figure 6:
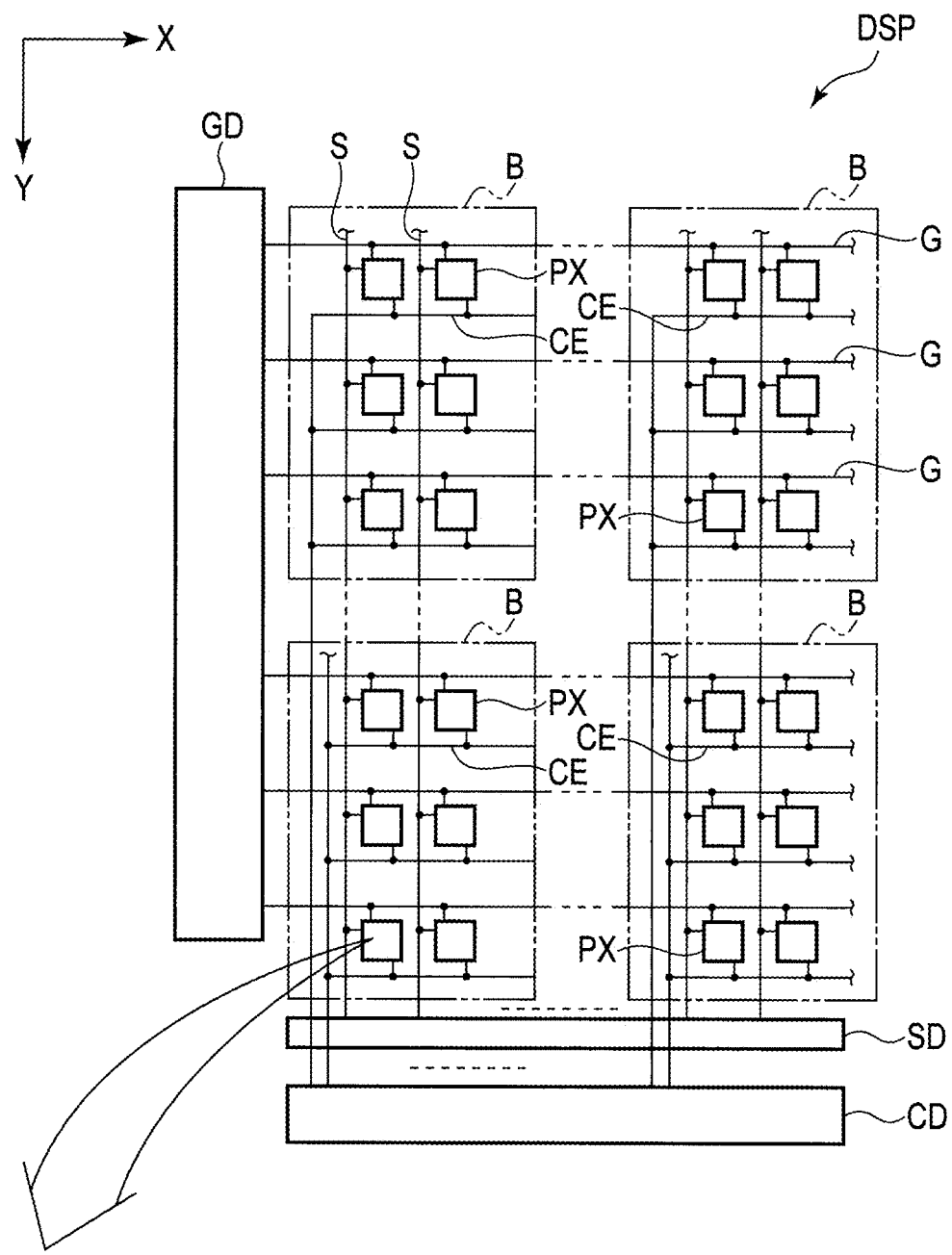
FIG. 6 is a diagram showing a basic configuration of the sub-pixels and an equivalent circuit.
Figure 6:
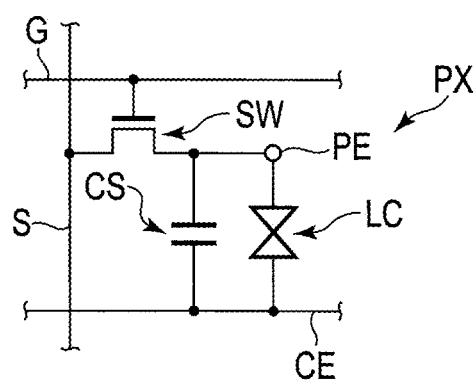

FIG. 6 is a diagram showing a basic configuration of the sub-pixels and an equivalent circuit.

The scanning lines G are connected to a scanning line drive circuit GD. A plurality of signal lines S are connected to a signal line drive circuit SD. The scanning lines G and signal lines S are each formed of metal materials such as aluminum (Al), titanium (Ti), silver (Ag), molybdenum (Mo), tungsten (W), copper (Cu) and chromium (Cr), an alloy of these metal materials and the like. The scanning lines G and signal lines S each may have a single-layer structure or a multi-layer structure. For example, the scanning lines G are formed of an alloy of molybdenum (Mo) and tungsten W. For example, the signal lines S are formed of a stacked layer body in which titanium (Ti), aluminum (Al) and titanium (Ti) are stacked in this order. The scanning lines G or the signal lines S need not necessarily extend linearly, but part of each signal may be bent. For example, even though part of each of the signal lines S is bent, it is considered that the signal lines S extend in the second direction Y.

The common electrode CE is provided for each sensor block B. The common electrode CE is connected to the voltage supply unit CD of the common voltage (Vcom) and disposed all over the sub-pixels PX. The common electrode CE is a transparent electrode that is formed of transparent conductive materials such as indium tin oxide (ITO) and indium zinc oxide (IZO). In addition, the common electrode CE is also connected to the IC chip 2, for example, the touch controller built into the IC chip 2, as described above, to form a sensor electrode Rx to which a touch drive voltage is applied in the touch sensing mode.

Each of the sub-pixels PX includes a switching element SW, a pixel electrode PE, a common electrode CE, a liquid crystal layer LC and the like. The switching element SW is configured by, e.g., a thin film transistor (TFT) and electrically connected to the scanning lines G and signal lines S. The scanning lines G are connected to the switching element SW in each of the sub-pixels PX arranged in the first direction X. The signal lines S are connected to the switching element SW in each of the sub-pixels PX arranged in the second direction Y. The pixel electrode PE is electrically connected to the switching element SW. The pixel electrode PE is a transparent electrode that is formed of transparent conductive materials such as ITO and IZO. The pixel electrode PE is opposed to the common electrode CE to drive the liquid crystal layer LC by an electric field generated between the pixel electrode PE and the common electrode CE. Storage capacity CS is formed between, for example, an electrode whose potential is the same as that of the common electrode CE and an electrode whose potential is the same as that of the pixel electrode PE.

Figure 7:
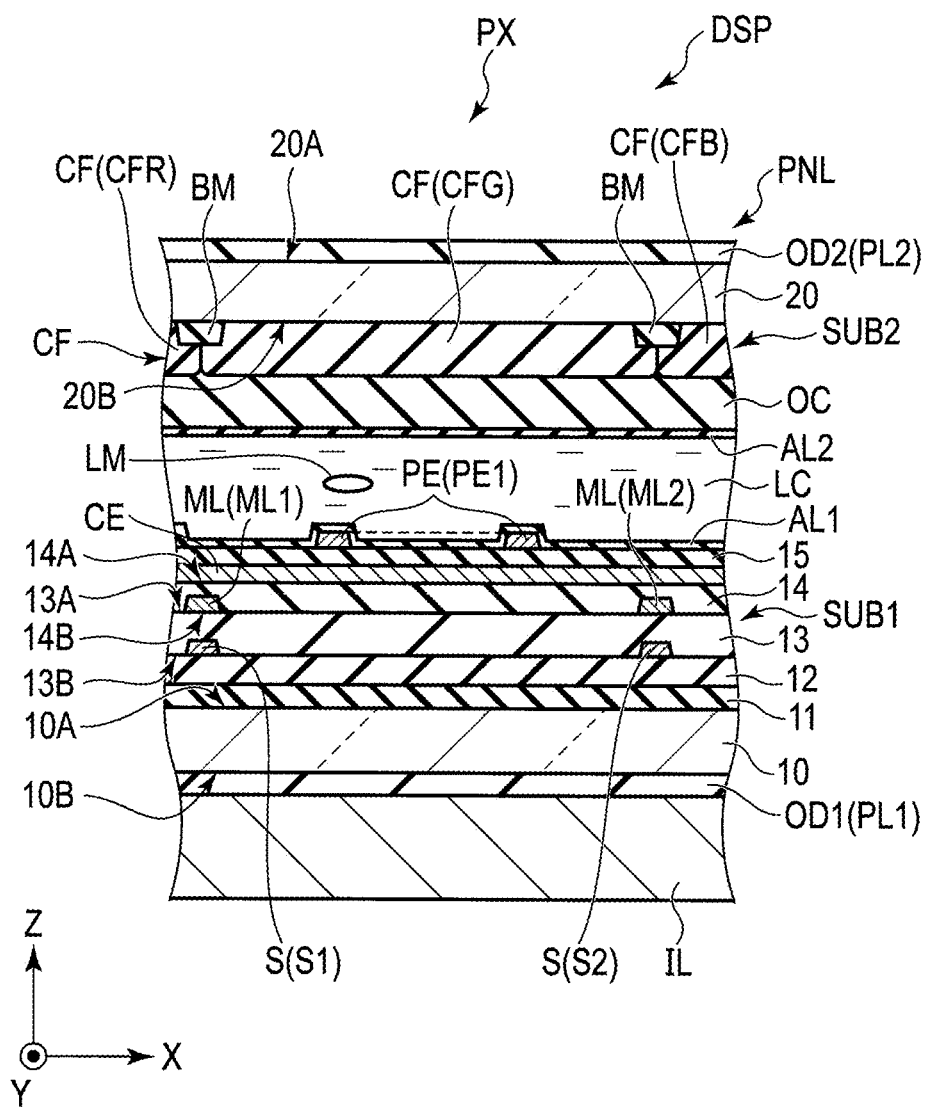
FIG. 7 is a sectional view showing a configuration example of part of a display panel shown in FIGS. 1 through 3.

FIG. 7 is a sectional view showing a configuration example of part of the display panel PNL shown in FIGS. 1 through 3. FIG. 7 shows, for example, a configuration of an area correspond in to the sub-pixel PX. FIG. 7 also shows an example in which the display mode using a lateral electric field is applied.

The first substrate SUB1 includes an insulating substrate 10, insulating layers 11 to 15, signal lines S (S1, S2, . . . ), metal lines ML (ML1, ML2, . . . ), a common electrode CE, an alignment film AL1, and the like.

The insulating substrate 10 is a substrate having optical transparency, such as a glass substrate and a flexible resin substrate. The insulating substrate 10 has an upper surface 10A and a lower surface 10B on the opposite side. The insulating layer 11 is formed on the insulating substrate 10. The insulating layer 12 is formed on the insulating layer 11. The signal lines S are formed on the insulating layer 12. In the example illustrated in FIG. 7, the signal lines S1 and S2 are spaced apart from each other in the first direction X. The insulating layer 13 has an upper surface 13A, and a lower surface 13B on the opposite side. The insulating layer 13 is formed on the insulating layer 12 to cover the signal lines S. The metal lines ML are each formed of metal materials such aluminum (Al), titanium (Ti), silver (Ag), molybdenum (Mo), tungsten (W), copper (Cu) and chromium (Cr), an alloy of these metal materials and the like. The metal lines ML each may have a single-layer structure or a multi-layer structure. For example, the metal lines ML are formed of a stacked layer body in which titanium (Ti), aluminum (Al) and titanium (Ti) are stacked in this order. The metal lines ML also function as, for example, sensor lines L that are electrically connected to the sensor electrode Rx. When the metal lines ML function as sensor lines L, they are electrically connected to the sensor electrode Rx, for example, the common electrode CE. In the example illustrated in FIG. 7, the metal lines ML1 and ML2 are located directly above the signal lines S1 and S2, respectively. The insulating layer 14 has an upper surface 14A and a lower surface 14B on the opposite side. The insulating layer 14 is formed on the insulating layer 13 to cover the insulating layer 13 and the metal lines ML. The common electrode CE is formed on the insulating layer 14. The insulating layer 15 is formed on the common electrode CE to cover the common electrode CE. In other words, the insulating layer 13, the insulating layer 14 and the common electrode CE are located between the insulating layer 12 and the insulating layer 15 located above the insulating layer 12 and the insulating layer 12. The pixel electrode PE (PE1) is provided on the insulating layer 15. The alignment film AL1 is formed on the insulating layer 15 to cover the insulating layer 15 and the pixel electrode PE. In the first substrate SUB1, another layer may be formed between the layers.

The insulating layers 11, 12 and 15 are inorganic insulating layers formed by inorganic insulating materials such as silicon oxide, silicon nitride and silicon oxynitride. The insulating layers 11, 12 and 15 may have a single-layer structure or a multi-layer structure. The insulating layers 13 and 14 are organic insulating layers (organic films) formed by organic insulating materials such as an acrylic resin.

The second substrate SUB2 includes an insulating substrate 20, a light-shielding layer BM, a color filter CF, an overcoat layer OC, an alignment film AL2 and the like.

Like the insulating substrate 10, the insulating substrate 20 is a substrate having optical transparency, such as a glass substrate and a resin substrate. The insulating substrate 20 has an upper surface 20A and a lower surface 20B on the opposite side. The light-shielding layer BM and the color filter CF are located on the lower surface 20B opposed to the insulating substrate 10. The color filter CF is disposed opposite to the pixel electrode PE (PE1) and its part is superposed on the underside of the light-shielding layer BM. The color filter CF has a red color filter CFR, a green color filter CFC and a blue color filter CFB. The color filter CF may have a white color filter. The overcoat layer OC is located on the underside of the color filter CF to cover the color filter CF. The overcoat layer OC is formed of a transparent resin. The overcoat layer OC can also be formed of, for example, a transparent organic material and considered to be a transparent organic film. The alignment film AL2 is located on the underside of the overcoat layer OC to cover the overcoat layer OC. The alignment films AL1 and AL2 are formed of, for example, a material exhibiting horizontal alignment property. In the second substrate SUB2, another layer may be formed between the layers.

The foregoing first and second substrates SUB1 and SUB2 are disposed such that the alignment films AL1 and AL2 are opposed to each other. The first and second substrates SUB1 and SUB2 are bonded to each other by the foregoing sealing member SE with a predetermined cell gap formed as shown in FIG. 7. The liquid crystal layer LC is held between the alignment films AL1 and AL2. The liquid crystal layer LC contains liquid crystal molecules LM. The liquid crystal layer LC is formed of a liquid crystal material of a positive type (dielectric anisotropy is positive) or a liquid crystal material of a negative type (dielectric anisotropy is negative).

An optical element OD1 including a polarizer PL1 is bonded to the insulating substrate 10. An optical element OD2 including a polarizer PL2 is bonded to the insulating substrate 20. The optical elements OD1 and OD2 may include a retardation film, a scattering layer, an antireflective layer and the like, if necessary.

In the foregoing display panel PNL, in an off state where no electric field is formed between the pixel electrode PE and the common electrode CE, the liquid crystal molecules LM are initially aligned in a predetermined direction between the alignment films AL1 and AL2. In this off state, the light applied to the display panel PNL from the illumination unit IL is absorbed by the optical elements OD1 and OD2 to make a dark display. In an on state where an electric field is formed between the pixel electrode PE and the common electrode CE, the liquid crystal molecules LM are aligned in a direction other than the initial alignment direction by the electric field, and the alignment direction is controlled by the electric field. In this on state, part of the light from the illumination unit IL passes through the optical elements OD1 and OD2 to make a bright display.

Figure 8:
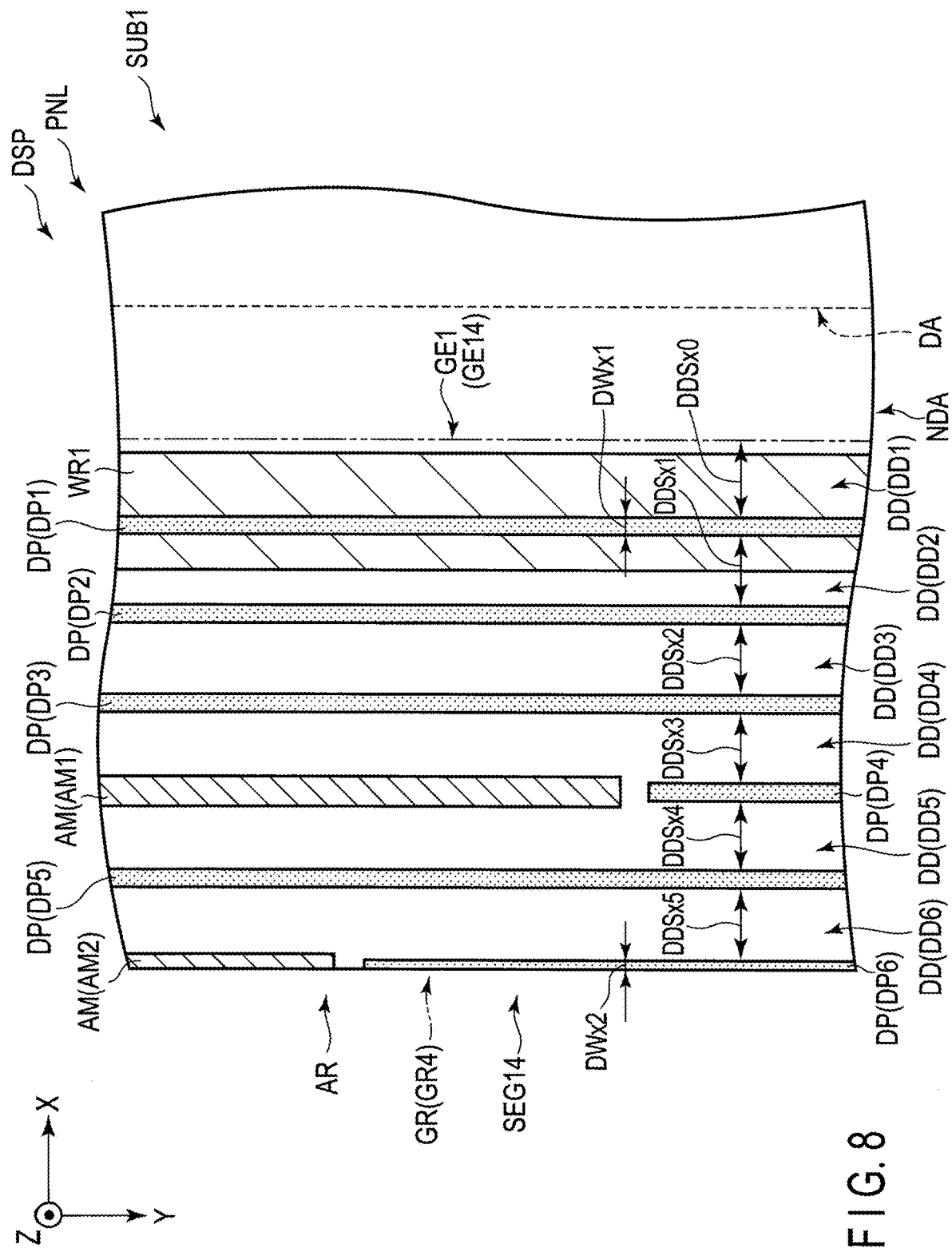
FIG. 8 is a plan view schematically showing a configuration example of a first substrate in an area shown in FIGS. 1 through 3.

FIG. 8 is a plan view schematically showing a configuration example of the first substrate SUB1 of an area AR illustrated in FIGS. 1 to 3. FIG. 8 shows only the configuration required for the description.

In the first substrate SUB1, the non-display area NDA includes a groove portion GR (GR4), a peripheral line WR1, a plurality of convex portions DP (DP1, DP2, DP3, DP4, DP5, DP6, . . . ), a plurality of concave portions DD (DD1, DD2, DD3, DD4, DD5, DD6, . . . ) and a plurality of metal lines AM (AM1, AM2, . . . ).

The groove portion GR has an end portion GE1 located closer to the display area DA than the substrate edge of the first substrate SUB1. In the example shown in FIG. 8, the groove portion GRA has an end portion GE14 located closer to the display area DA than the substrate edge SEG14. The groove portion GR4 is formed to extend from the substrate edge to the end portion GE14. The horizontal width of the groove portion GR4 from the substrate edge to the end portion GE14 is, for example, 150 μm to 200 μm.

In the non-display area NDA, the peripheral line WR1 is located closer to the display area DA than the substrate edge of the first substrate SUB1. In the example illustrated in FIG. 8, in the non-display area NDA, the peripheral line WR1 is located closer to the display area DA than the substrate edge and extends in the second direction Y.

The convex portions DP are arranged at intervals. For example, the convex portions DP are superposed on the groove portion GR. In the example illustrated in FIG. 8, the convex portions DP1 to DP6 are superposed on the groove portion GR4. In the groove portion GR4, the convex portions DP1 to DP6 are arranged at intervals in the first direction X and extend in the second direction Y. The horizontal width DWx1 of the convex portions DP1 to DP5 is, for example, 7 μm or less. The horizontal width DWx1 may be greater than 7 μm. The horizontal width DWx2 of the convex portion DP6 is almost half the horizontal width DWx1 of the convex portions DP1 to DP5 and is, for example, 7 μm to 4 μm. The convex portion DP1 is spaced at a distance DDSx0 from the end portion GE14 toward the substrate edge in the first direction X. The distance DDSx0 is, for example, 20 μm to 25 μm. The convex portion DP1 is superposed on the peripheral line WR1. The convex portion DP2 is spaced at a distance DDSx1 from the convex portion DP1 toward the substrate edge in the first direction X. The distance DDSx1 is, for example, 15 μm to 20 μm. The convex portion DP3 is spaced at a distance DDSx2 from the convex portion DP2 toward the substrate edge in the first direction X. The distance DDSx2 is, for example, 15 μm to 20 μm. The convex portion DP4 is spaced at a distance DDSx3 from the convex portion DP3 toward the substrate edge SEG14 in the first direction X. The distance DDSx3 is, for example, 15 μm to 20 μm. The convex portion DP4 is spaced in the second direction Y from the metal line AM1 to be described later. In other words, the convex portion DP4 is located on a line extending in the second direction Y from the metal line AM1 and is not superposed on the metal line AM1. The convex portion DP4 may be superposed on the metal line AM1. The convex portion DP5 is spaced at a distance DDSx4 from the convex portion DP4 toward the substrate edge in the first direction X. The distance DDSx4 is, for example, 15 μm to 20 μm. The convex portion DP6 is spaced at a distance DDSx5 from the convex portion DP5 toward the substrate edge in the first direction X. The distance DDSx5 is, for example, 15 µm to 20 µm. The convex portion DP6 extends in the second direction Y along the substrate edge. The convex portion DP6 is spaced in the second direction Y from the metal line AM2 to be described later. In other words, the convex portion DP6 is located on a line extending in the second direction Y from the metal line AM2 and is not superposed on the metal line AM2. The convex portion DP6 may be superposed on the metal line AM2. In the example illustrated in FIG. 8, the six convex portions DP are arranged, but seven or more convex portions may be arranged or five or less convex portions DP may be arranged. The distances DDSx0 to DDSx5 may be the same or may be different.

Each of the concave portions DD is located between adjacent two convex portions DP. The concave portions DD are arranged at intervals. The concave portions DD are superposed on, for example, the groove portion GR. In the example shown in FIG. 8, the concave portions DD1 to DD6 are superposed on the groove portion GR4. In the groove portion GR4, the concave portions DD1 to DD6 are arranged at intervals in the first direction X and extend in the second direction Y. The concave portion DD1 is located between the end portion GE14 and the convex portion DP1. The concave portion DD2 is located between the convex portions DP1 and DP2. The concave portion DD3 is located between the convex portions DP2 and DP3. The concave portion DD4 is located between the convex portions DP3 and DP4 and between the convex portion DP3 and the metal line AM1. The concave portion DD5 is located between the convex portion DP4 and the convex portion DP5 and between the metal line AM1 and the convex portion DP5. The concave portion DD6 is located between the convex portions DP5 and DP6 and between the convex portion DP5 and the metal line AM2.

The metal lines AM are disposed at intervals. The metal lines AM superposed on, for example, the groove portion GR. The metal lines AM are used to confirm the dimensions of the display panel PNL when it is polished. Thus, the metal lines AM are disposed at a start position, a termination position, an intermediate position, etc., of an area of the display panel PNL which is curved in planar view and an area thereof which is to be polished. As an example, the area of the display panel PNL which is curved in planar view and an area thereof which is to be polished is, for example, a corner portion of the display panel. The metal lines AM are disposed at a start position, a termination position and an intermediate position of a corner portion of, e.g., the first substrate SUBJ. In the example shown in FIG. 8, the metal lines AM1 and AM2 are superposed on the groove portion GR4. In the groove portion GR4, the metal lines AM1 and AM2 are arranged at intervals in the first direction X and extend in the second direction Y. In the first direction X, the metal line AM1 is located between the convex portions DP3 and DP5. The metal line AM1 is spaced apart from the convex portion DP4 in a position opposite to the arrow indicating the second direction Y. The metal line AM2 extends in the second direction Y along the substrate edge. The metal line AM2 is spaced apart from the convex portion DP6 in a direction opposite to the arrow indicating the second direction Y. In the example shown in FIG. 8, the two metal lines AM are disposed in the non-display area NDA, but one metal line AM may be disposed therein or three or more metal lines AM may be disposed therein.

Figure 9:
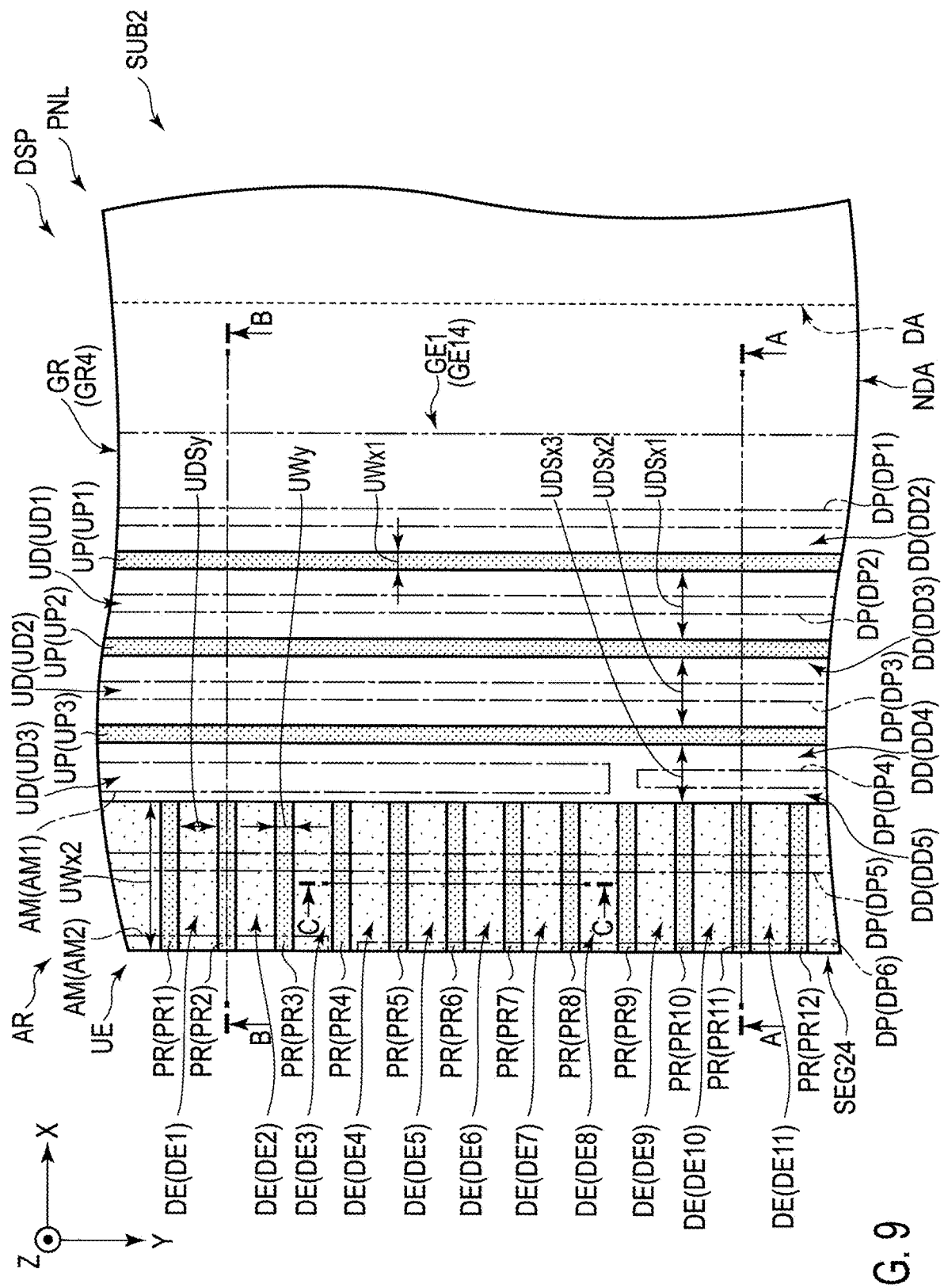
FIG. 9 is a plan view schematically showing a configuration example of a second substrate in the area shown in FIGS. 1 through 3.

FIG. 9 is a plan view schematically a configuration example of the second substrate SUB2 of the area AR illustrated in FIGS. 1 to 3. FIG. 9 shows only the configuration required for the description. In FIG. 9, the main portions of the first substrate SUB1 shown in FIG. 8 are indicated by one-dot-one-dash lines, two-dot-one-dash lines and the like.

In the second substrate SUB2, the non-display area NDA includes a plurality of convex portions UP (UP1, UP2, UP3, . . . ), a plurality of concave portions UD (UD1, UD2, UD3, . . . ) and an uneven layer P.

The convex portions UP are arranged at intervals. In the example shown in FIG. 9, the convex portions UP1 to UP3 are arranged at intervals in the first direction X and extend in the second direction Y. The horizontal width UWx1 of the convex portions UP1 to UP3 is, for example, 7 µm or less. The horizontal width UWx1 may be greater than 7 µm. The convex portion UP1 is superposed on the concave portion DD2. The convex portion UP1 may be superposed on the convex portion DP1 or DP2. In the first direction X, the convex portion UP2 is spaced at a distance UDSx1 from the convex portion UP1 toward the substrate edge. The distance UDSx1 is, for example, 15 µm to 20 µm. The convex portion UP2 is superposed on the concave portion DD3. The convex portion UP2 may be superposed on the convex portion DP2 or DP3. In the first direction X, the convex portion UP3 is spaced at a distance UDSx2 from the convex portion UP2 toward the substrate edge. The distance UDSx2 is, for example, 15 µm to 20 µm. Furthermore, in the first direction X, the convex portion UP3 is spaced at a distance UDSx3 from the uneven layer UP toward the display area DA. The distance UDSx3 is, for example, 10 µm to 15 µm. The convex portion UP3 is superposed on the concave portion DD4. The convex portion UP3 may be superposed on the convex portion DP3 or the convex portion DP4 and the metal line AM1.

The concave portion UD is located between adjacent two convex portions UP. The concave portions UD are arranged at intervals. In the example illustrated in FIG. 9, the concave portions UD1 to UD3 are arranged at intervals in the first direction X and extend in the second direction Y. The concave portion UD1 is located between the convex portions UP1 and UP2. The concave portion UD1 is superposed on the convex portion DP2. The concave portion UD1 may be superposed on the concave portions DD2 and DD3. The concave portion UD2 is located between the convex portions UP2 and UP3. The concave portion UD2 is superposed on the convex portion DP3. The concave portion UD2 may be superposed on the concave portion DD3 or DD4. The concave portion UD3 is located between the convex portion UP3 and the uneven layer UE. The concave portion UD3 is superposed on the convex portion DP4 and the metal line AM2. In other words, the concave portion UD3 is superposed on the concave portion DD4 and DD5. The concave portion UD3 may be superposed on the concave portion DD4 or DD5.

The uneven layer UE includes a plurality of convex portions PR (PR1, PR2, PR3, PR4, PR5, PR6, PR7, PR8, PR9, PR10, PR11, PR12, . . . ) and a plurality of concave portions DE (DE1, DE2, DE3, DE4, DE5, DE6, DE7, DE8, DE9, DE10, DE11, . . . ). For example, the uneven layer UE is disposed along the substrate edge of the second substrate SUB2. The convex portions PR are arranged at intervals in a direction different from that of the convex portions UP. For example, the convex portions PR are arranged at smaller intervals than the convex portions UP. The concave portions DE are each located between adjacent two convex portions PR. The concave portions DE are arranged at intervals in a direction different from that of the concave portions DD.

Since the convex portions PR are formed integrally rather than separately on the uneven layer UE, they can be prevented from peeling off.

In the example illustrated in FIG. 9, the uneven layer UE extends in the second direction Y along the substrate edge SEG24. In the first direction X, the uneven layer UE is spaced at a distance UDSx3 from the convex portion UP3 toward the substrate edge. The uneven layer UE includes convex portions PR1 to PR12 and concave portions DE1 to DE11. The convex portions PR1 to PR12 are arranged at intervals UDSy in the second direction Y and extend in the first direction X. Each of the intervals UDSy is smaller than each of the distances UDSx1 to UDSx3 and is, for example, 7 μm to 10 μm. The interval UDSy may be smaller than 7 μm or larger than 10 μm. In addition, the convex portions PR1 to PR12 may be arranged at different intervals in the second direction Y. The horizontal width UWx2 of the convex portions PR1 to PR12 is, for example, 45 μm to 50 μm. The vertical width UWy of the convex portions PR1 to PR12 is, for example, 7 μm or less. The vertical width UWy may be larger than 7 μm. The convex portions PR1 to PR12 may not be formed integrally but may be arranged separately. The concave portions DE1 to DE11 are arranged at intervals in the second direction Y and extend in the first direction X. The concave portion DE1 is located between the convex portions PR1 and PR2. The concave portion DE2 is located between the convex portions PR2 and PR3. The concave portion DE3 is located between the convex portions PR3 and PR4. The concave portion DE4 is located between the convex portions PR4 and PR5. The concave portion DE5 is located between the convex portions PR5 and PR6. The concave portion DE4 is located between the convex portions PR6 and PR7. The concave portion DE7 is located between the convex portions PR7 and PR8. The concave portion DE8 is located between the convex portions PR8 and PR9. The concave portion PR9 is located between the convex portions PR9 and PR10. The concave portion DE10 is located between the convex portions PR10 and PR11. The concave portion DE11 is located between the convex portions PR11 and PR12.

Figure 10:
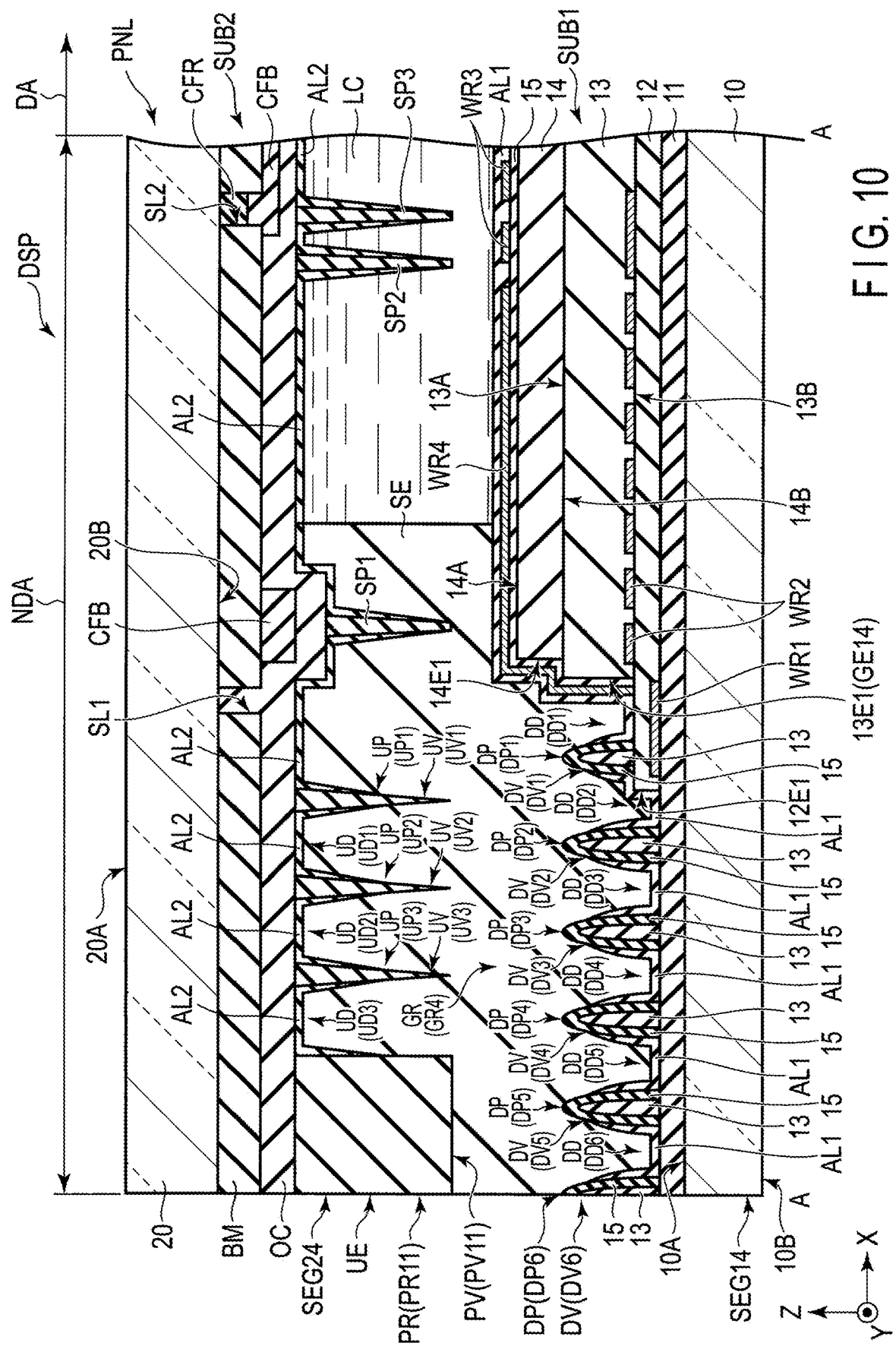
FIG. 10 is a sectional view showing the display panel along line A-A of FIG. 9.

FIG. 10 is a sectional view of the display panel PNL taken along line shown in FIG. 9. FIG. 10 shows the non-display area NDA of the display panel PNL.

In the example shown in FIG. 10, the groove portion GR4 is formed through the insulating layers 12 to 14 and the like. The groove portion GR4 is located between the substrate edge and each of an end portion 12E1 of the insulating layer 12, an end portion 13E1 of the insulating layer 13 and an end portion 14E1 of the insulating layer 14. The end portion 13E1 is located closer to the display area DA than the substrate edge. The end portion 12E1 is located closer to the substrate edge than the end portion 13E1 in the first direction X. The end portion 14E1 is located closer to the display area DA than the end portion 13E1 in the first direction X. In other words, the end portion 12E1 is exposed from the insulating layers 13 and 14 in the groove portion GR4, and the end portion 13E1 is exposed from the insulating layer 14 in the groove portion GR4. The end portion 12E1 may be located in the same position as the end portion 13E1 in the first direction X and may be located closer to the display area DA than the end portion 13E1. The end portion 14E1 may be located in the same position as the end portion 13E1 in the first direction X and may be located closer to the substrate edge SEG14 than the end portion 13E1. The end portion 13E1 corresponds to, for example, the end portion GE14 shown in FIGS. 8 and 9. The end portion 14E1 may correspond to the end portion GE14. The groove portion GR (GR4) so formed can block the entry route of moisture transmitted through the insulating layers 13 and 14 from outside the display panel PNL.

In the first substrate SUB1, the non-display area NDA includes peripheral lines WR1 to WR4 and the like. The peripheral line WR1 is disposed in the same layer as the scanning line G and formed of the same material as the scanning line G. In the example illustrated in FIG. 10, the peripheral line WR1 is located between the insulating layer 11 and the end portion 12E1 of the insulating layer 12. The peripheral line WR1 may be located in the insulating layer 12 in the third direction Z. In this case, like the peripheral line WR1, the scanning line G is located in the insulating layer 12 in the third direction Z. The peripheral line WR1 is disposed outside various lines because it functions as a guard ring to prevent static electricity and an outside electric field from acting on the display area DA and a light-shielding layer to prevent light leakage. In the example shown in FIG. 10, the end portion 12E1 extends closer to the substrate edge SEG14 than the end portion 13E1 of the insulating layer 13 and the end portion 14E1 of the insulating layer 14 in order to cover the peripheral line WR1. On the other hand, the bonding strength between the insulating layers 11 and 12 is small and thus the end portion 12E1 does not extend to the substrate edge. In other words, the end portion 12E1 is located closer to the display area DA than the substrate edge. The peripheral line WR2 is disposed in the same layer as the signal line S and is formed of the same material as the signal line S. In the example shown in FIG. 10, the peripheral line WR2 is located between the insulating layers 12 and 13. The insulating layer 15 extends to the side of the end portion 13E1 from the top of the insulating layer 14 through the side of the end portion 14E1. Since a step is formed between the end portions 13E1 and 14E1, the insulating layer 15 tends to adhere to the end portions 13E1 and 14E1. The peripheral lines WR3 and WR4 are disposed in the same layer as the pixel electrode PE and formed of the same material as the pixel electrode. In the example shown in FIG. 10, the peripheral lines WR3 and WR4 are located between the insulating layer 15 and the alignment film AL1. The peripheral line WR3 is located closer to the display area DA than the peripheral line WR4 on the insulating layer 15. The peripheral line WR4 extends to the side of the end portion 13E1 from the top of the insulating layer 14 through the end portion 14E1 along the insulating layer 15. The alignment film AL1 extends to the groove portion GR4 from the top of the insulating layer 15 and the peripheral line WR4 through the end portions 13E1 and 14E1. For example, when the alignment film AL1 is directly disposed on the insulating layer 15, it is likely to peel off because the bonding strength between the alignment film AL1 and the insulating layer 15 is small. In the present embodiment, the bonding strength between the peripheral line WR4 and each of the insulating layer 15 and the alignment film AL1 is sufficiently higher than, for example, the bonding strength between the alignment film AL1 and the insulating layer 15. Thus, the possibility of peeling between the peripheral line WR4 and the insulating layer 15 or the alignment film AL1 is lower than, for example, the possibilty of peeling between the alignment film. AL1 and the insulating layer 15. If, however, the peripheral line WR4 is extended to the substrate edge SEG14, problems such as electro-static discharge (ESD) and corrosion of the peripheral line WR4 may occur.

The convex portions DP protrude toward the second substrate SUB2. Each of the convex portions DP includes, for example, its corresponding insulating layers 13 and 15, and the convex portion DP and the insulating layers 13 and 15 are stacked in this order. For example, the bonding strength between the convex portions DP and the alignment film AL1 is low. The convex portions DP may include the alignment film AL1. The convex portions DP may include at least one of the insulating layers 13 and 15. The convex portions DP may include layers other than the insulating layers 13 and 15 and the alignment film AL1. Further, a protruding portion other than the convex portions DP may be referred to as a convex portion. The convex portions DP each have a top portion DV. The convex portions DP are covered with the alignment film AL1 except the top portion DV. In other words, at least the top portion DV of the convex portion DP is exposed from the alignment film AL1. A portion other than the top portion DV of each of the convex portions DP may be exposed from the alignment film AL1 or the entire portion thereof may be exposed from the alignment film AL1. The section of each of the convex portions DP is, for example, tapered at an acute angle toward the top portion DV. For example, the section of each of the convex portions DP is formed in a substantially triangular shape. The thickness of each of the convex portions DP is, for example, equal to or greater than that of the insulating layer 13. In other words, the thickness of each of the convex portions DP is, for example, equal to or greater than half of the thicknesses of the insulating layers 13 and 14. For example, the thickness of each of the convex portions DP is 2.0 µm to 3.0 µm. If the convex portions DP are formed with the sectional shape and thickness described so far, the alignment film AL1 flows down from the convex portions DP toward the concave portions DD when the alignment film AL1 is applied to the convex portions DP at the time of manufacturing of the first substrate SUB1, with the result that at least the top portion DV of each of the convex portions DP is exposed from the alignment film AL1. The section of each of the convex portions DP may have a shape other than the foregoing shape if a portion exposed from the alignment film. AL1 is formed in the manufacturing step of the first substrate SUB1. In addition, the thickness of each of the convex portions DP may be smaller than that of the insulating layer 13 if a portion exposed from the alignment film AL1 is formed in the manufacturing step of the first substrate SUB1. The convex portions DP are, for example, in contact with the sealing member SE. The top portion DV can be bonded to the sealing member SE with a sufficient bonding strength, e.g., a stronger bonding strength than the bonding strength between the insulating layer 15 and the alignment film AL1. The concave portions DD are recessed toward the insulating substrate 10 with respect to two continuous convex portions DP. The concave portions DD are formed through, for example, the insulating layers 12, 13 and 14 and the like, and each composed of two continuous convex portions DP and the insulating layer 11.

In the example illustrated in FIG. 10, the convex portion DP1 is located on the end portion 12 E1. In other words, the convex portion DP1 is located between the sealing member SE and the end portion 12 E1. The convex portions DP2 to DP6 are located on the insulating layer 11. In other words, the convex portions DP1 to DP6 are located between the sealing member SE and the insulating layer 11. The convex portion DP1 is located at a position that is higher than the convex portions DP2 to DP6 in the third direction Z. Note that that another layer may be located between the convex portion DP1 and the insulating layer 12. Another layer may be located between the convex portions DP2 to DP6 and the insulating layer 11. The convex portion DP1 need not be located on the end portion 12E1. The convex portion DP1 may be located across the end portion 12E1 and the insulating layer 11. In addition, the convex portion DP2 may be located on the end portion 12 E1. The convex portion DP1 has a top portion DV1. The convex portion DP2 has a top portion DV2. The convex portion DP3 has a top portion DV3. The convex portion DP4 has a top portion DV4. The convex portion DP5 has a top portion DV5. The convex portion DP6 has a top portion DV6. The top portions DV1 to DV6 are exposed from the alignment film AL1 and bonded to the sealing member SE. At least one of the top portions DV1 to DV6 has only to be bonded to the sealing member SE. The alignment film AL1 is located in the concave portions DD1 to DD6. In the concave portions DD1 to DD6, another layer may be located between the insulating layer 11 and the alignment film AL1.

The light-shielding layer BM has a slit SL1 penetrating to the insulating substrate 20. The slit SL1 makes it possible to prevent moisture from penetrating through the light-shielding layer BM. Since the foregoing peripheral line WR1 is disposed to be superposed on the sift SL1, light leakage from the slit SL1 is suppressed. The light-shielding layer BM also has a slit SL2 in a region that is superposed on the liquid crystal layer LC. The slit SL2 makes it possible to block the transfer of electric charges to the display area DA through the light-shielding layer BM. In the manufacturing process of the display panel PNL, therefore, the concentration of static electricity in the display area DA can be suppressed, as can be damage to the display panel PNL. Since the foregoing peripheral line WR2 is disposed to be superposed on the slit SL2, light leakage from the slit SL2 is suppressed. The color filters CFR and CFB are disposed to be superposed on the slit SL2 in the third direction Z. The light leakage from the slit SL2 can thus be suppressed even for the light transmitted through the periphery of the peripheral line WR2.

The second substrate SUB2 includes spacers SP1 to SP3 and the like. The spacers SP1 to SP4 are located on the undersurface of the overcoat layer OC and protrude toward the first substrate SUB1. The spacers SP1 to SP3 are formed of a resin material. In addition, the color filter CFB for height adjustment is disposed to be superposed on the spacer SP1.

The convex portions UP are located below the overcoat layer OC and protrude toward the first substrate SUB1. The convex portions UP are formed in the same layer as, for example, the spacers SP1 to SP3. The convex portions UP are formed of the same material as that of the spacers SP1 to SP3 and the like and formed of, for example, a resin material. That is, the convex portions UP correspond to spacers. For example, the strength of bonding of the convex portions UP to the alignment film AL2 is small, as is the strength of bonding of the alignment film AL2 to the sealing member SE. The convex portions UP each have a top portion UV. The convex portions UP are covered with the alignment film AL2, except their top portions UV. In other words, at least the top portions UV of the convex portions UP are exposed from the alignment film AL2. Note that a portion of each convex portion UP other than the top portion UV may be exposed from the alignment film AL2 or all of each convex portion UP may be exposed therefrom. The section of each convex portion UP is, for example, tapered at an acute angle toward the top portion UV. For example the section of each convex portion UP is formed in a triangular shape. For example, the thickness of each convex portion UP is 2.0 µm or more. The section of each convex portion UP may be formed in a shape other than the above-described shape as long as a portion of the convex portion UP is exposed from the alignment film AL2 in the manufacturing step of the second substrate SUB2. The convey portions UP are in contact with, for example, the sealing member SE. The bonding strength between the top portions UV and the sealing member SE is greater than, for example, the bonding strength between the convex portions UP and the alignment film AL2. In addition, the bonding strength between the top portions UV and the sealing member SE is greater than, for example, the bonding strength between the alignment film AL2 and the sealing member SE. The concave portions UD are recessed toward the insulating substrate 20 with respect to two continuous convex portions UP. The concave portions UD are each composed of, for example, two continuous convex portions UP and an overcoat layer OC. If the convex portions UP are formed with the sectional shape and thickness described above, the alignment film AL2 flows down from the convex portions UP toward the concave portions UD when the alignment film AL2 is applied to the convex portions UP at the time of manufacturing of the second substrate SUB2, with the result that at least the top portion UV of each of the convex portions UP is exposed from the alignment film AL2. Note that the color filter CFB for height adjustment may be disposed to be superposed on the convex portions UP.

In the example illustrated in FIG. 10, the convex portions UP1 to UP3 are located below the overcoat layer OC and protrude toward the first substrate SUB1. In other words, the convex portions UP1 to UP3 are located between the member SE and the overcoat layer OC. The convex portions UP1 to UP3 are formed in the same layer as the spacers SP1 to SP3. Another layer may be formed between the convex portions UP1 to UP3 and the overcoat layer OC. The convex portion UP1 has a top portion UV1. The convex portion UP2 has a top portion UV2. The convex portion UP3 has a top portion UV3. The top portions UV1 to UV3 are exposed from the alignment film AL2 and bonded to the sealing member SE. At least one of the top portions UV1 to UV3 has only to be bonded to the sealing member SE. The alignment film AL2 is formed in the concave portions UD1 to UD3. In the concave portions UD1 to UD3, another layer may be formed between the overcoat layer OC and the alignment film AL2.

The uneven layer UP is located below the overcoat layer OC. The uneven layer UP is formed in the same layer as, for example, the convex portions UP and the spacers SP1 to SP3. The uneven layer UP is formed of the same material as that of the spacers SP1 to SP3 and the like and formed of, for example, a resin material. That is, the uneven layer UE corresponds to a spacer. For example, the strength of bonding of the uneven layer UP to the alignment film AL2 is small. The convex portions PR each have a top portion PV. The convex portions PR are covered with the alignment film AL2, except their top portions PV. In other words, at least the top portions PV of the convex portions PR are exposed from the alignment film AL2. Note that a portion of each convex portion PR other than the top portion PV may be exposed from the alignment film AL2 or all of each convex portion PR may be exposed therefrom. Note that the color filter CFB for height adjustment may be disposed to be superposed on the uneven layer UE.

In the example illustrated in FIG. 10, the uneven layer UP is located below the overcoat layer OC. In other words, the uneven layer UE is located between the sealing member SE and the overcoat layer OC. Note that another layer may be formed between the uneven layer UP and the overcoat layer OC. The uneven layer UP includes a convex portion PR11. The convex portion PR11 has a top portion PV11. The top portion PV11 of the convex portion PR11 is bonded to the sealing member SE. If at least one of the top portions UV1 to UV3 is bonded to the sealing member SE, the top portion PV11 need not be bonded to the sealing member SE.

The liquid crystal layer LC is surrounded by the first and second substrates SUB1 and SUB2 and the sealing member SE.

Figure 11:
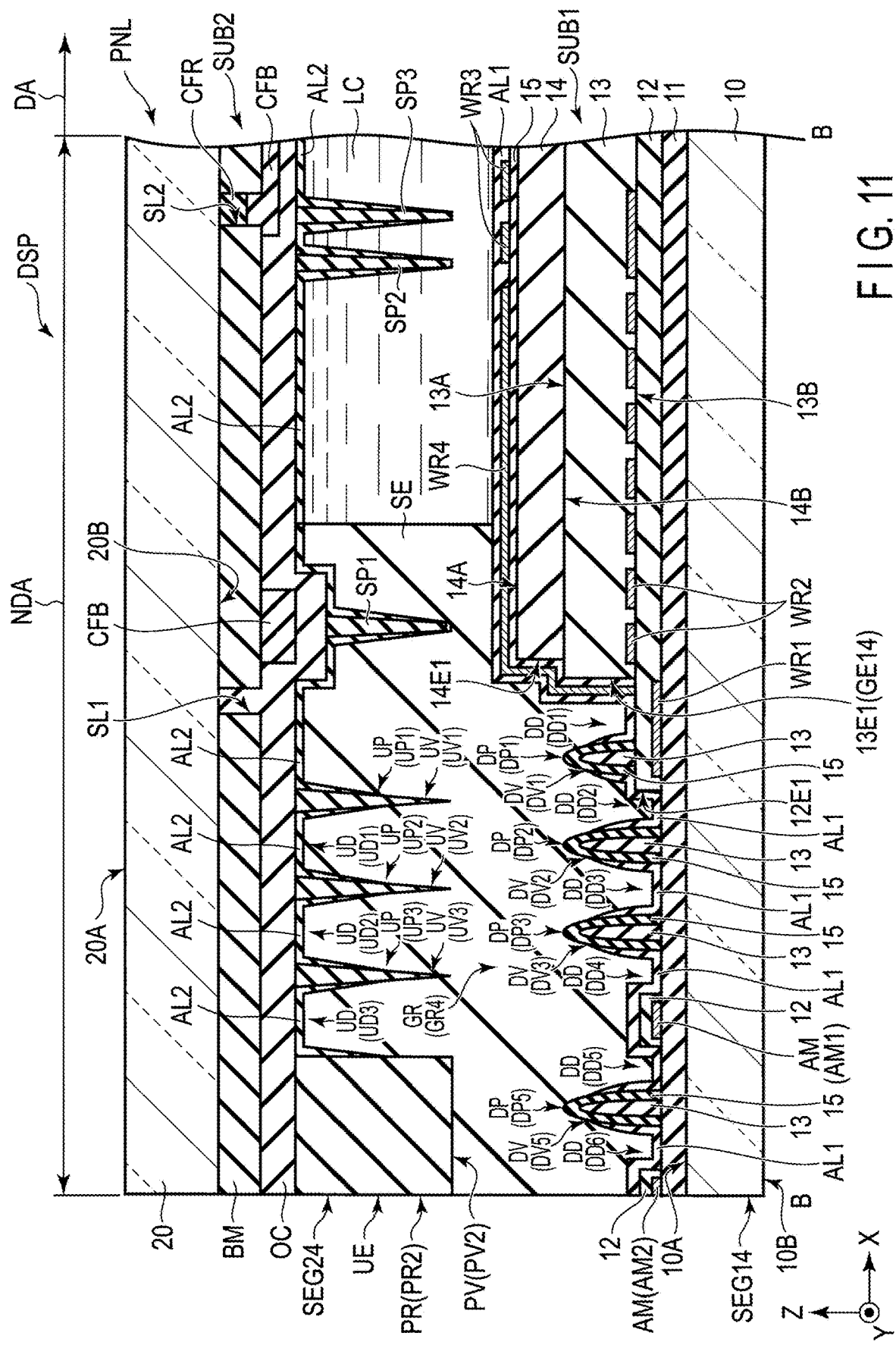
FIG. 11 is a sectional view showing the display panel along line B-B of FIG. 9.

FIG. 11 is a sectional view of the display panel. PNL taken along line B-B shown in FIG. 9. FIG. 11 illustrates a non-display area NDA of the display panel PNL.

In the example illustrated in FIG. 11, the metal lines AM1 and AM2 are located on the insulating layer 11. In other words, the metal lines AM1 and AM2 are located between the sealing member SE and the insulating layer 11. The metal lines AM1 and AM2 are covered with the insulating layer 12 and the alignment film AL1. The convex portion DP3 may be located on the metal line AM1 or on the metal line AM1 and over the insulating layer 11. The convex portion DP5 may be located on the metal line AM1 or on the metal line AM1 and over the insulating layer 11. The convex portion DP5 may also be located on the metal line AM2 or on the metal line API and over the insulating layer 11. The convex portion PR2 has a top portion PV2. The top portion PV2 is bonded to the sealing member SE. If at least one of the top portions UV1 to UV3 is bonded to the sealing member SE, the top portion PV2 need not be bonded to the sealing member SE.

Figure 12:
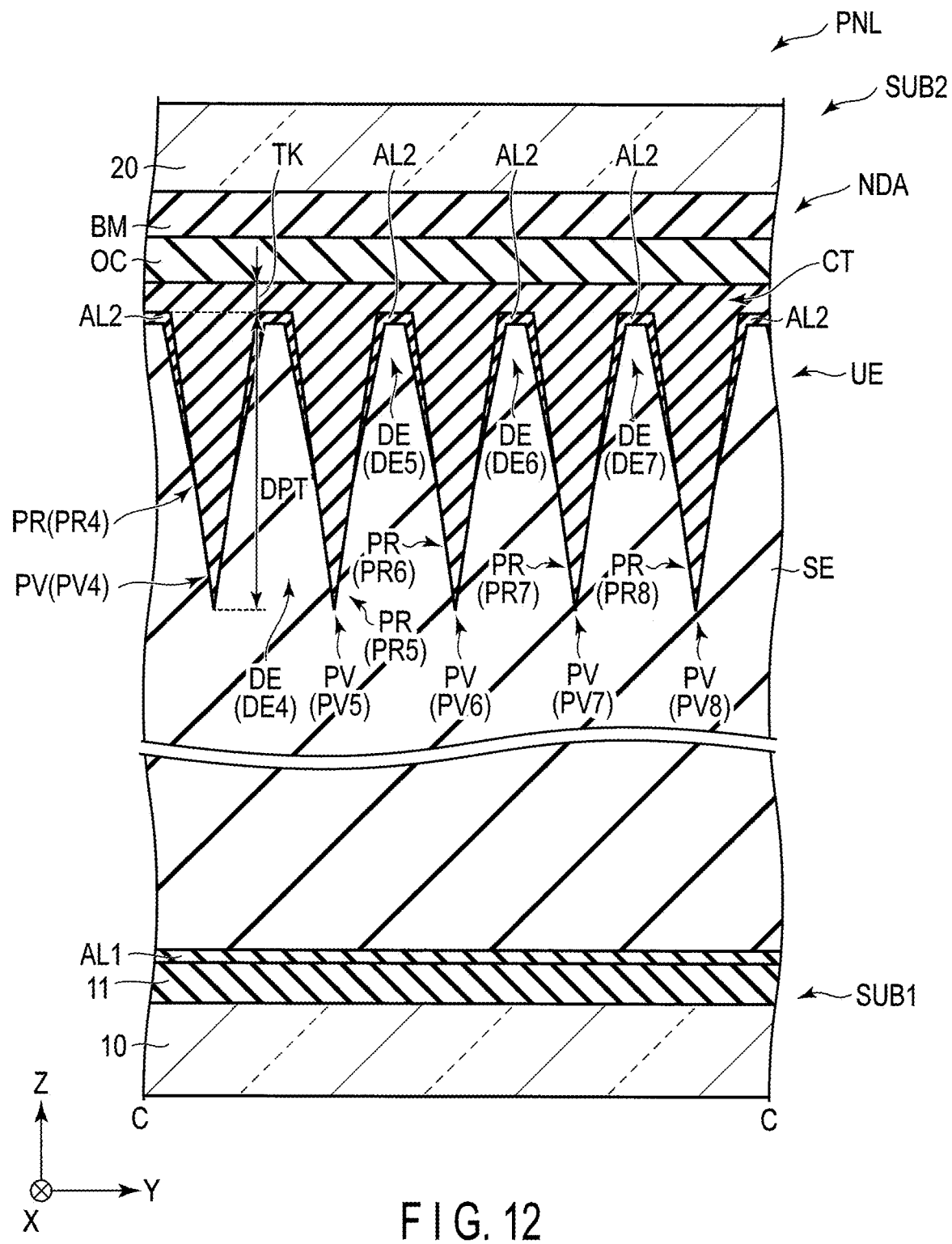
FIG. 12 is a sectional view showing the second substrate along line C-C of FIG. 9.

FIG. 12 is a sectional view showing the second substrate SUB2 along line C-C shown in FIG. 9. FIG. 12 shows a non-display area NDA of the second substrate SUB2.

The convex portions PR protrude toward the first substrate SUB1 in the third direction Z. The convex portions PR are connected to each other via a connection portion CT on the side opposite to the first substrate SUB1. In other words, the convex portions PR are connected to each other via the connection portion CT on the side opposite to the top portions PV and are formed integrally as one unit. The connection portion CT is located between the top portions PV and the overcoat layer OC. The section of each convex portion PR is, for example, tapered at an acute angle toward the top portion PV. For example, the section of each convex portion PR is formed in a triangular shape. The section of each of the convex portions PR may have a shape other than the foregoing shape if a portion exposed from the alignment film AL2 is formed in the manufacturing step of the second substrate SUB2. The convex portions PR are in contact with, for example, the sealing member SE. The strength of bonding between the top portions PV and the sealing member SE is greater than that of bonding between, for example, the convex portions PR and the alignment film AL2. In addition, the strength of bonding between the top portions PV and the sealing member SE is greater than, for example, the strength of bonding between the alignment film AL2 and the sealing member SE. The concave portions DE are recessed toward the connection portion CT with respect to two continuous convex portions PR. For example, the depth DPT of each concave portion CE is greater than the thickness. TK of the connection portion CT. The concave portions DE are each composed of, for example, continuous two convex portions PR and the connection portion CT. If the convex portions UP are formed with the sectional shape and thickness described above, the alignment film AL2 flows down from the convex portions UP toward the concave portions UP when the alignment film AL2 is applied to the convex portions UP at the time of manufacturing of the second substrate SUB2, with the result that at least the top portion UV of each of the convex portions UP is exposed from the alignment film AL2.

In the example shown in FIG. 12, the uneven layer UE includes convex portions PR4 to PR8 and concave portions PE4 to PE7. The convex portion PR4 has a top portion PV4. The convex portion PR5 has a top portion PV5. The convex portion PRES has a top portion PV6. The convex portion PR7 has a top portion PV7. The convex portion PR8 has a top portion PV8. The convex portions PRA to PR8 are connected to each other via the connection portion CT on the side opposite to the first substrate SUB1. The connection portion CT is located between the overcoat layer OC and the top portions PV4 to PV8. In other words, the convex portions PRA to PV8 and the connection portion CT are located between the overcoat layer OC and the sealing member SE. The connection portion CT is in contact with, for example, the overcoat layer OC. The top portions PV4 to PV8 are each exposed from the alignment film AL2 and bonded to the sealing member SE. Note that at least one of the top portions PV4 to PV8 has only to be bonded to the sealing member SE. The alignment film AL2 is formed in the concave portions DE4 to DE7. In the concave portions DE4 to DE7, another layer may be formed between the connection portion CT and the alignment film AL2.

According to the present embodiment, the display device DSP includes a first substrate SUB1, a second substrate SUB2 opposed to the first substrate SUB1, and a sealing member SE by which the first and second substrates SUB1 and SUB2 are bonded to each other. The second substrate SUB2 includes convex portions UP and an uneven layer UE. The convex portions UP protrude toward the first substrate SUB1. The section of each of the convex portions UP is, for example, tapered at an acute angle toward the second substrate SUB2. If the convex portions UP are so formed, at least the top portions UV of the convex portions UP are exposed from the alignment film AL2 even though the alignment film AL2 is applied to the convex portions UP at the time of manufacturing of the second substrate SUB2. The uneven layer UP includes convex portions PR. The convex portions PR protrude toward the first substrate SUB1. The section of each of the convex portions PR is, for example, tapered at an acute angle toward the second substrate SUB2. If the convex portions PR are so formed, at least the top portions PV of the convex portions PR are exposed from the alignment film AL2 even though the alignment film AL2 is applied to the convex portions PR at the time of manufacturing of the second substrate SUB2. When the first and second substrates SUB1 and SUB2 are bonded together, the top portions UV and PV are directly bonded to the sealing member SE. Thus, the display device DSP makes it possible to form an area that can be bonded with sufficient bonding strength. The display device DSP can suppress peeling of the display panel PNL caused by impact or the like. Therefore, the display device DSP can be improved in its reliability.

Furthermore, in planar view, the convex portions UP extend in the second direction Y, for example and the convex portions PR extend in the first direction X, for example. The arrangement of these convex portions extending in the different directions makes it possible to suppress peeling caused in the display panel PNL.

Next is a description of a display device DSP according to each of modifications and other embodiments. In the following modifications and embodiments, elements similar to the above-described first embodiment are denoted by similar reference symbols and their descriptions will be omitted or simplified. Elements different from those of the first embodiment will mainly be described in detail.

The display device DSP according to modification 1 of the first embodiment differs from the display device DSP according to the first embodiment in the configurations of convex portions DP and UP.

FIG. 13 is a plan view schematically showing an example of the configuration of a first substrate SUB1 according to modification 1 of the first embodiment. The first substrate SUB1 shown in FIG. 13 corresponds to the first substrate SUB1 of the area AR shown in FIGS. 1 to 3. FIG. 13 shows only the configuration necessary for description.

Some of the convex portions DP each have an axial portion DX and a plurality of branch portions DB extending from the axial portion DX. All the convex portions DP may each have an axial portion DX and a plurality of branch portions DB extending from the axial portion DX. In the example shown in FIG. 13, the convex portion DP3 includes an axial portion DX3 extending in the second direction Y and a plurality of branch portions DB3 extending in the first direction X from the axial portion DX3. The horizontal width DWx3 of the axial portion DX3 is equal to the horizontal width DWx1 of the convex portion DP1 and is, for example, 7 μm or less. The horizontal width DWx3 may be larger than 7 μm. The axial portion DX3 is separated by a distance DDSx2 from the convex portion DP2 toward the substrate edge SEG14 in the first direction X. The branch portions DB3 extend from the axial portion DX3 toward the substrate edge SEG. 14 in the first direction X. The branch portions DB3 may extend from the axial portion DX3 toward only the display area DA in the first direction X or may extend from the axial portion DX3 toward both the substrate edge and the display area DA. The branch portions DB3 are arranged at intervals DIy in the second direction Y. Each of the intervals DIy is, for example, 14 μm. The branch portions DB3 are not opposed to a metal line AM1 in the first direction X. In other words, the convex portion DP3 does not have the branch portions DB3 in a portion opposed to the metal line AM1 in the first direction X. The horizontal width DBWx1 of the convex portion DP3 in which the branch portions DB3 extend from the axial portion DX3 is, for example, 14 μm.

In the example shown in FIG. 13, the convex portion DP4 includes an axial portion DX4 extending in the second direction Y and a plurality of branch portions DB4 extending from the axial portion DX4 in the first direction X. The horizontal width of the axial portion DX4 is equal to the horizontal width DWx3 of the axial portion DX3, for example. The axial portion DX4 is separated by a distance DDSx3 from the axial portion DX3 toward the substrate edge SEG14 in the first direction X. In the first direction X, the axial portion DX4 is separated by a distance DIx1 from the branch portion DB3, which extends from the axial portion D3 toward the substrate edge SEG14, toward the substrate edge SEG14. The distance DIx1 is, for example, 11 μm. In the first direction X, the branch portions DB4 extend from the axial portion DX4 toward both the substrate edge SEG14 and the display area DA. The branch portions DB4 are arranged such that two pairs of branch portions DB4 extend from the axial portion DX4 in opposite directions in the first direction X. The branch portions DB4 may extend from the axial portion DX4 only toward the substrate edge SEG14 or the display area DA in the first direction X. Like the branch portions DB3, the branch portions DB4 are arranged at intervals DIy in the second direction Y. The branch portions DB4 are not opposed to the branch portions DB3 in the first direction X. In other words, the branch portions DB4 are opposed to the axial portion DX3 between two branch portions DB3 in the first direction X. The horizontal width DBWx2 of the convex portion DP4 in which two pairs of branch portions DB4 extend from the axial portion DX4 toward both the substrate edge SEG14 and the display area DA is, for example, 21 µm.

In the example shown in FIG. 13, the convex portion DP5 includes an axial portion DX5 extending in the second direction Y and a plurality of branch portions DB5 extending from the axial portion DX5 in the first direction X. The horizontal width of the axial portion DX5 is equal to the horizontal width DWx3 of the axial portion DX3, for example. The axial portion DX5 is separated by a distance DDSx4 from the axial portion DX4 toward the substrate edge SEG14 in the first direction X. Some of the branch portions DB5 extend from the axial portion DX5 toward the display area DA in the first direction X. Some of the branch portions DB5 extend from the axial portion DX5 to both the substrate edge SEG14 and the display area DA in the first direction X. Some of the branch portions DB5 are arranged such that two pairs of branch portions DB5 extend from the axial portion DX5 in opposite directions in the first direction X. The two pairs of branch portions DB5 are separated by a distance DIx2 from the axial portion DX4 toward the substrate edge SEG14 in they first direction X. The distance DIx2 is, for example, 11 µm. The branch portions DB5 may extend only to the display area DA or only to the substrate edge SEG14 in the first direction X. The branch portions DB5 may extend to both the display area DA and the substrate edge SEG14 in the first direction X. Like the branch portions DB3, the branch portions DB5 are arranged at intervals DIy in the second direction Y. The branch portions. DB5 are not opposed to the metal lines AM1 and AM2 in the first direction X. In other words, the convex portion DP5 does not have the branch portions DB5 in a portion opposed to at least one of the metal lines AM1 and AM2 in the first direction X. The branch portions DB5 are not opposed to the branch portions DB4 in the first direction X. In other words, the branch portions DB5 are opposed to the axial portion DX4 between two branch portions DB4 in the first direction X. The horizontal width of the convex portion DP5 in which two pairs of branch portions DB5 extend from the axial portion DX5 to both the substrate edge SEG14 and the display area DA is equal to, for example, the horizontal width DBWx2 of the convex portion DP4. The horizontal width of the convex portion DP5 in which the branch portions DB5 extend from the axial portion DX5 toward the substrate edge SEG14 is equal to, for example, the horizontal width DBWx1 of the convex portion DP3.

In the example shown in FIG. 13, the convex portion DP6 includes an axial portion DX6 extending in the second direction Y and a plurality of branch portions DB6 extending from the axial portion DX6 in the first direction X. The horizontal width of the axial portion DX6 is equal to the horizontal width DWx3 of the axial portion DX3, for example. The axial portion DX6 is separated by a distance DDSx5 from the axial portion DX5 toward the substrate edge SEG14 in the first direction X. In the first direction X, the axial portion DX6 is separated by a distance Dix3 from the branch portion DB5, which extends from the axial portion DX5 toward the substrate edge SEG14, toward the substrate edge SEG14. The distance DIx3 is, for example, 11 µm. In the first direction X, the branch portions DB6 extend from the axial portion DX6 toward the display area DA. Like the branch portions DB3, the branch portions DB6 are arranged at intervals DIy in the second direction Y. The branch portions DB6 are not opposed to the branch portions DB5 in the first direction X. In other words, the branch portions DB6 are opposed to the axial portion DX5 between two branch portions DB5 in the first direction X. The horizontal width DBWx2 of the convex portion DP6 in which the branch portions DB6 extend from the axial portion DX6 toward the display area DA, is equal to, for example, the horizontal width DBWx1 of the convex portion DP3.

Figure 14:
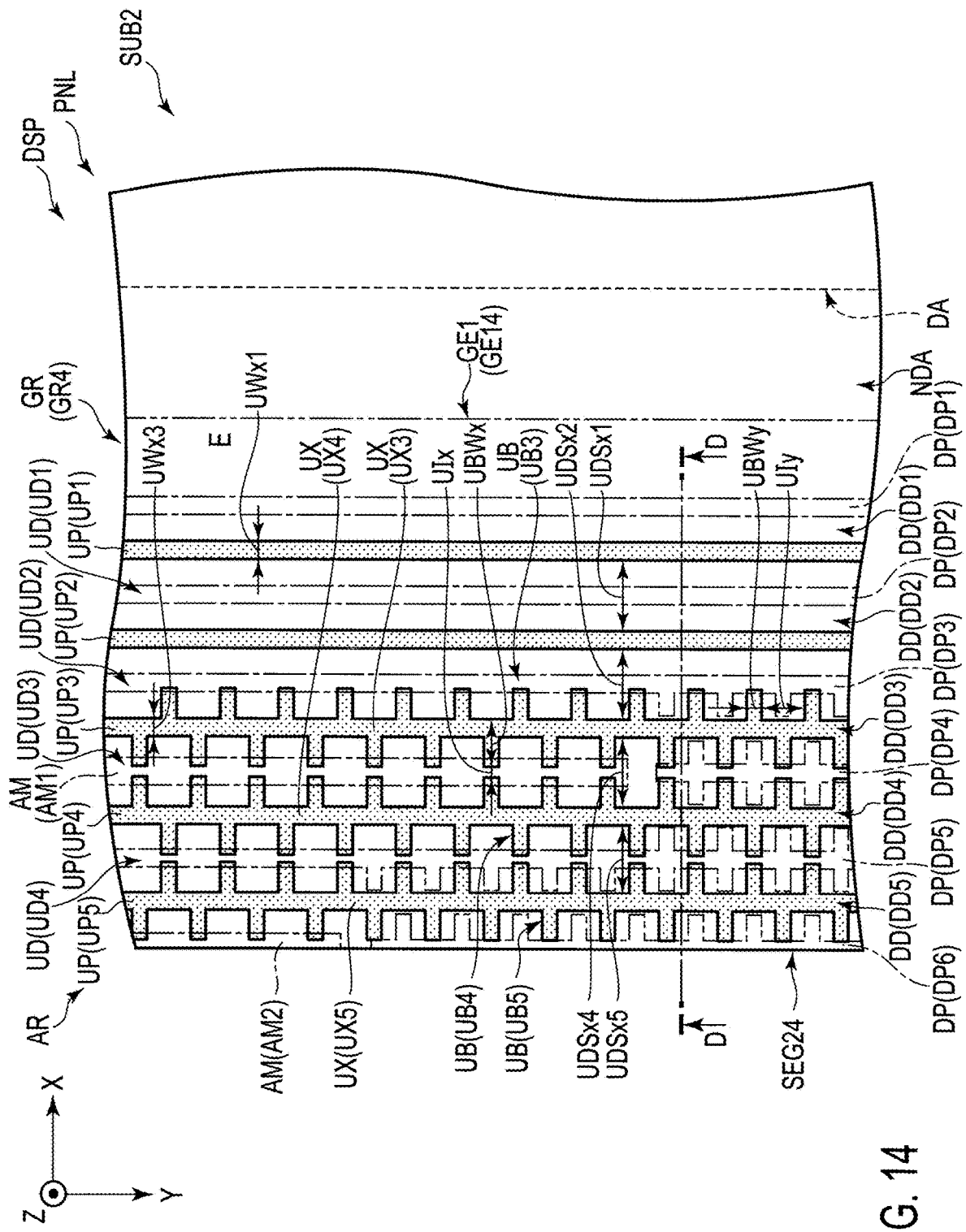
FIG. 14 is a plan view schematically showing a configuration example of a second substrate according to modification 1 of the first embodiment.

FIG. 14 is a plan view schematically showing an example of the configuration of a second substrate SUB2 according to modification 1 of the first embodiment. The second substrate SUB2 shown in FIG. 14 corresponds to the second substrate SUB2 of the area AR shown in FIGS. 1 to 3. FIG. 14 shows only the configuration necessary for description. In FIG. 14, the main portions of the first substrate SUB1 shown in FIG. 13 are indicated by one-dot-one-dash lines, two-dot-one-dash lines and the like.

In the second substrate SUB2, the non-display area NDA includes a plurality of convex portions UP (UP1, UP2, UP3, UP4, UP5, . . . ) and a plurality of concave portions UD (UD1, UD2, UD3, UD4, . . . ).

Some of the convex portions UP each have an axial portion UX and a plurality of branch portions UB extending from the axial portion UX. All the convex portions UP may each have an axial portion UX and a plurality of branch portions UB extending from the axial portion UX. In the example shown in FIG. 14, the convey portion UP3 includes an axial portion UX3 extending in the second direction Y and a plurality of branch portions UB3 extending in the first direction X from the axial portion UX3. The horizontal width UWx3 of the axial portion UX3 is equal to the horizontal width UWx1 of the convex portion UP1 and is, for example, 7 µm or less. The horizontal width UWx3 may be larger than 7 µm. The axial portion UX3 is superposed on the concave portion DD3. The axial portion UX3 may be superposed on the convex portion DP3 or the convex portion DP4. The axial portion UX3 is separated by a distance UDSx2 from the convex portion UP2 toward the substrate edge SEG24 in the first direction X. The branch portions UB3 extend from the axial portion UX3 toward both the substrate edge SEG24 and the display area DA in the first direction X. The branch portions UB3 are arranged to extend from the axial portion UX3 toward the substrate edge SEG24 and the display area DA alternately in the first direction X. In other words, the branch portions UB3 extending from the axial portion UX3 toward the substrate edge SEG24 in the first direction, are located between two continuous branch portions UB3 extending from the axial portion UX3 toward the display area DA in the first direction. The branch portions UB3 may extend from the axial portion UX3 toward only the display area DA in the first direction X or may extend from the axial portion UX3 toward only the substrate edge SEG24. The branch portions UB3 are arranged at intervals UIy in the second direction Y. Each of the intervals UIy is, for example, 14 µm. The horizontal width UBWx of the convex portion UP3 in which the branch portions UB3 extends from the axial portion UX3 is, for example, 14 µm.

In the example shown in FIG. 14, the convex portion UP4 includes an axial portion UX4 extending in the second direction Y and a plurality of branch portions UB4 extending from the axial portion UX4 in the first direction X. The horizontal width of the axial portion UX4 is equal to the horizontal width UWx3 of the axial portion UX3, for example. The axial portion UX4 is superposed on the concave portion DD4. The axial portion UX4 may be superposed on the convex portion DP4 or DP5. The axial portion UX4 is separated by a distance UDSx4 from the axial portion UX3 toward the substrate edge SEG24 in the first direction X. The distance UDSx4 is, for example, 18 µm. In the first direction X, the branch portions UB4 extend toward both the substrate edge SEG24 and the display area DA. The branch portions UB4 are arranged to extend from the axial portion UX4 toward the substrate edge SEG24 and the display area DA alternately in the first direction. In other words, a branch portion UB4 extending from the axial portion UX4 toward the substrate edge SEG24 in the first direction X is located between continuous two branch portions UB4 extending from the axial portion UX4 toward the display area DA in the first direction X. The branch portions UB4 may extend from the axial portion UX4 only toward the display area DA or the substrate edge SEG24 in the first direction X. Like the branch portions UB3, the branch portions UB4 are arranged at intervals DIy in the second direction Y. The branch portion UB4 extending from the axial portion UX4 toward the display area DA in the first direction X is opposed to the branch portion UB3 extending from the shaft UX3 toward the substrate edge SEG24 in the first direction X. The branch portion UB4 extending from the axial portion UX4 toward the display area DA in the first direction X is separated by a distance UIx in the first direction X from the branch portion UB3 extending from the axial portion UX3 toward the substrate edge SEG24 in the first direction X. The distance UIx is, for example, 4 µm. The horizontal width of the convex portion UP4 in which the branch portion UB4 extends from the axial portion UX4 is, for example, the same as the horizontal width UBWx of the convex portion UP3.

In the example shown in FIG. 14, the convex portion UP5 includes an axial portion UX5 extending in the second direction Y and a plurality of branch portions UB5 extending from the axial portion UX5 in the first direction X. The horizontal width of the axial portion UX5 is equal to the horizontal width UWx3 of the axial portion UX3, for example. The axial portion UX5 is superposed on the concave portion DD5. The axial portion UX5 may be superposed on the convex portion DP5 or DP6. The axial portion UX5 is separated by a distance UDSx5 from the axial portion UX4 toward the substrate edge SEG24 in the first direction X. The distance UDSx5 is, for example, 18 µm. In the first direction X, the branch portions UB5 extend toward both the substrate edge SEG24 and the display area DA. The branch portions UB5 are arranged to extend from the axial portion UX5 toward the substrate edge SEG24 and the display area DA alternately in the first direction. In other words, a branch portion UB5 extending from the axial portion UX5 toward the substrate edge SEG24 in the first direction X is located between continuous two branch portions UP5 extending from the axial portion UX5 toward the display area DA in the first direction X. The branch portions UB5 may extend from the axial portion UX5 only toward the display area DA or the substrate edge SEG24 in the first direction X. Like the branch portions UP5, the branch portions UB5 are arranged at intervals DIy in the second direction Y. The branch portion UB5 extending from the axial portion UX5 toward the display area DA in the first direction X is opposed to the branch portion UB4 extending from the shaft UX4 toward the substrate edge SEG24 the first direction X. The branch portion UP5 extending from the axial portion UX toward the display area DA in the first direction X is separated by a distance UIx in the first direction X from the branch port-on UB4 extending from the axial portion UX4 toward the substrate edge SEG24 in the first direction X. The horizontal width of the convex portion UP5 in which the branch portion UB5 extends from the axial portion UX5 is, for example, the same as the horizontal width UBWx of the convex portion UP3.

In the example shown in FIG. 14, the concave portion UD4 is located between the convex portions UP4 and UP5. The concave portion UD4 is superposed on the convex portion DP5. The concave portion UD4 may be superposed on the concave portion DD4 or DD5.

Figure 15:
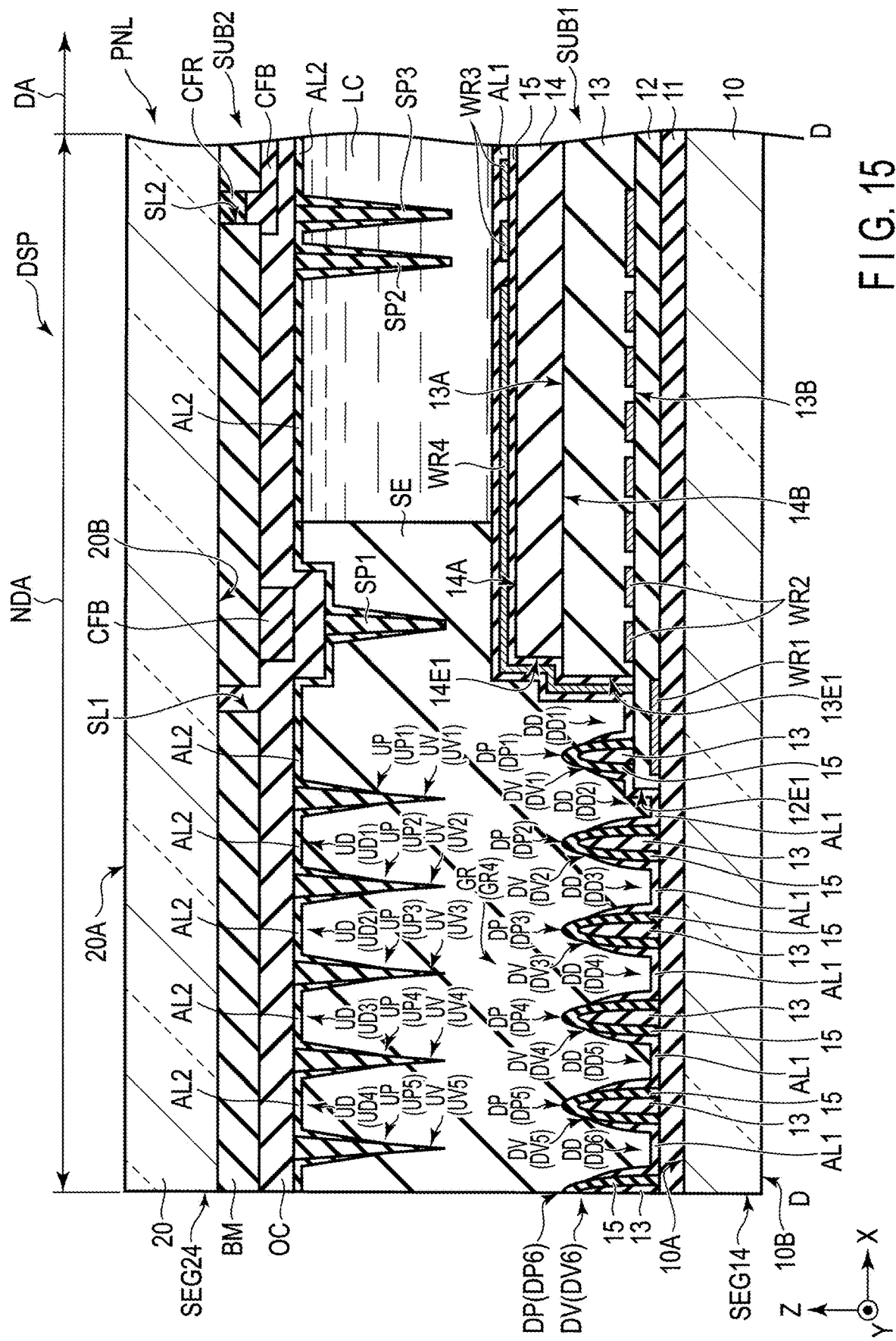
FIG. 15 is a sectional view showing a display panel along line D-D of FIG. 14.

FIG. 15 is a sectional view of the display panel PNL taken along line D-D shown in FIG. 14. FIG. 15 illustrates a non-display area NDA of the display panel PNL.

In the example illustrated in FIG. 15, the convex portions UP4 and UP5 are located below the overcoat layer OC and protrude toward the first substrate SUB1. In other words, the convex portions UP4 and UP5 are located between the overcoat layer OC and the sealing member SE. The convex portions UP4 and UP5 are formed in the same layer as the spacers SP1 to SP3. Another layer may be formed between the convex portions UP4 and UP5 and the overcoat layer OC. The convex portion UP4 has a top portion UV4. The convex portion UP5 has a top portion UV5. The top portions UV4 and UV5 are exposed from the alignment film AL2 and bonded to the sealing member SE. At least one of the top portions UV1 to UV5 has only to be bonded to the sealing member SE. The alignment film AL2 is formed in the concave portion UD4. In the concave portion UD4, another layer may be formed between the overcoat layer OC and the alignment film AL2.

The foregoing modification 1 can bring about the same advantages as those of the first embodiment.

The display device DSP according to modification 2 of the first embodiment differs from the display device DSP according to the first embodiment in the configurations of convex portions DP and UP.

Figure 16:
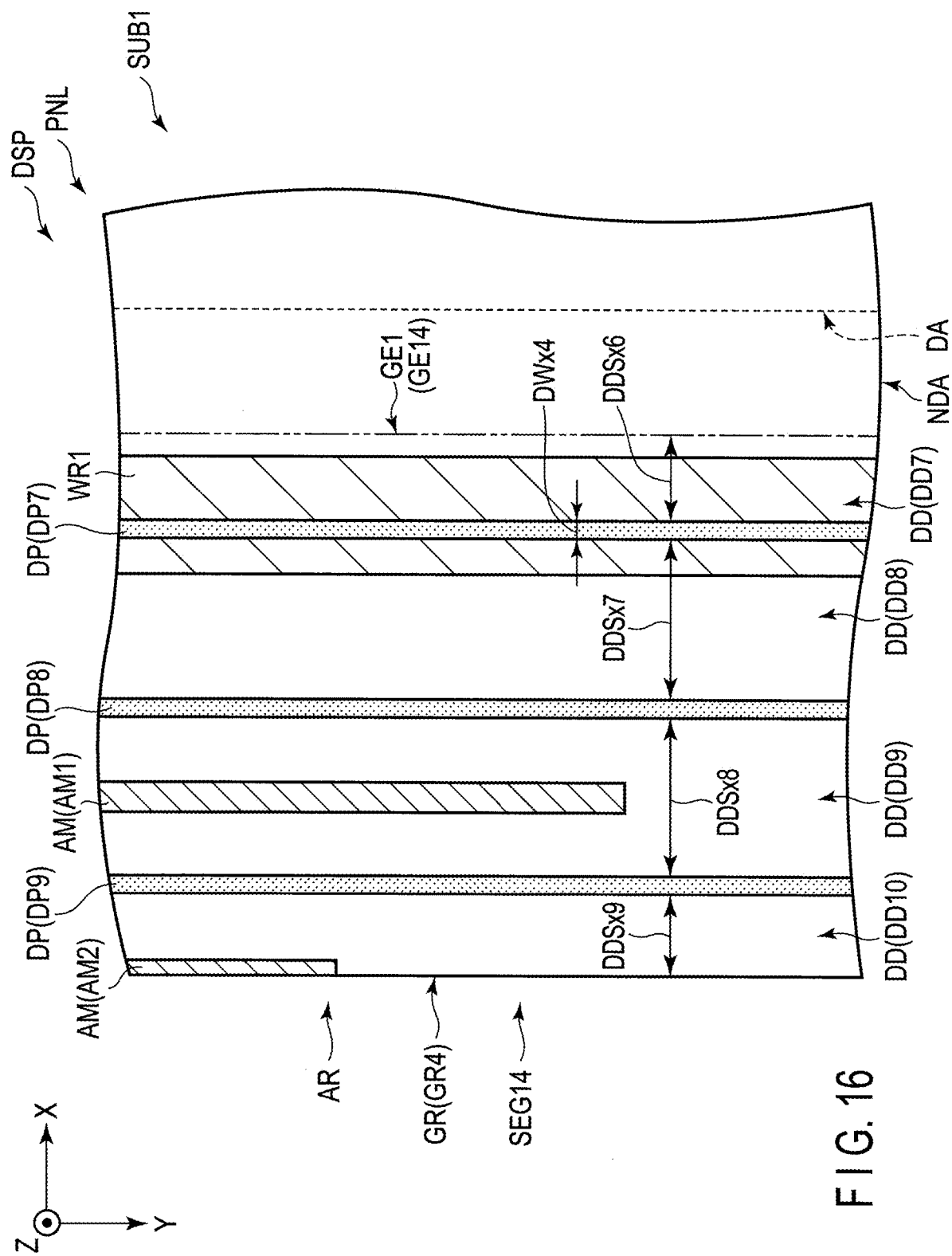
FIG. 16 is a plan view schematically showing a configuration example of a first substrate according to modification 2 of the first embodiment.

FIG. 16 is a plan view schematically showing an example of the configuration of a first substrate SUB1 according to modification 2 of the first embodiment. The first substrate SUB1 shown in FIG. 16 corresponds to the first substrate SUB1 of the area AR shown in FIGS. 1 to 3. FIG. 16 shows only the configuration necessary for description.

In the first substrate SUB1, the non-display area NDA includes a plurality of convex portions DP (DP7, DP8, DP9, . . . ) and a plurality of concave portions DD (DD7, DD8, DD9, DD10, . . . ).

In the example shown in FIG. 16, the convex portions DP7 to DP9 are superposed on the groove portion GR4. In the groove portion GR4, the convex portions DP7 to DP9 are arranged at intervals in the first direction X and extend in the second direction Y. The horizontal width DWx4 of the convex portions DP7 to DP9 is, for example, 7 µm or less. The horizontal width DWx4 may be greater than 7 µm. In the first direction X, the convex portion DP7 is separated by a distance DDSx6 from the end portion GE14 toward the substrate edge SEG14. The distance DDSx6 is, for example, 20 µm to 25 µm. The convex portion DP7 is superposed on a peripheral line WR1. In the first direction X, the convex portion DP8 is separated by a distance DDSx7 from the convex portion DP7 toward the substrate edge SEG14. The distance DDSx7 is, for example, 40 µm to 45 µm. In the first direction X, the convex portion DP5 is separated by a distance DDSx8 from the convex portion DP8 toward the substrate edge. The distance DDSx8 is, for example, 40 µm to 45 µm. In the first direction X, the convex portion DOS is also separated by a distance DDSx9 from the substrate edge SEG14 toward the display area DA. The distance DDSx9 is, for example, 20 µm to 25 µm. In the example shown in FIG. 16, three convey portions DP are arranged, but more than three or less than three convex portions DP may be arranged. The distances DDSx6 to DDSx9 may be the same or different.

In the example shown in FIG. 16, the concave portions DD7 to DD10 are superposed on the groove portion GR4. In the groove portion GR4, the concave portions DD7 to DD10 are arranged at intervals in the first direction X and extend in the second direction Y. The concave portion DD7 is located between the end portion GE14 and the convex portion DP7. The concave portion DD8 is located between the convex portions DP7 and DP8. The concave portion DD9 is located between the convex portions DP8 and DP5. The concave portion DD10 is located between the convex portion DP9 and the substrate edge.

In the example shown in FIG. 16, the metal line AM1 is located between the convex portions DP5 and DP5 in the first direction X. In other words, the metal line AM1 is superposed on the concave portion DD9. The metal line AM2 is spaced apart from the convex portion DP9 in a position opposite to the arrow indicating the second direction Y. In other words, the metal line AM2 is superposed on the concave portion DD10.

Figure 17:
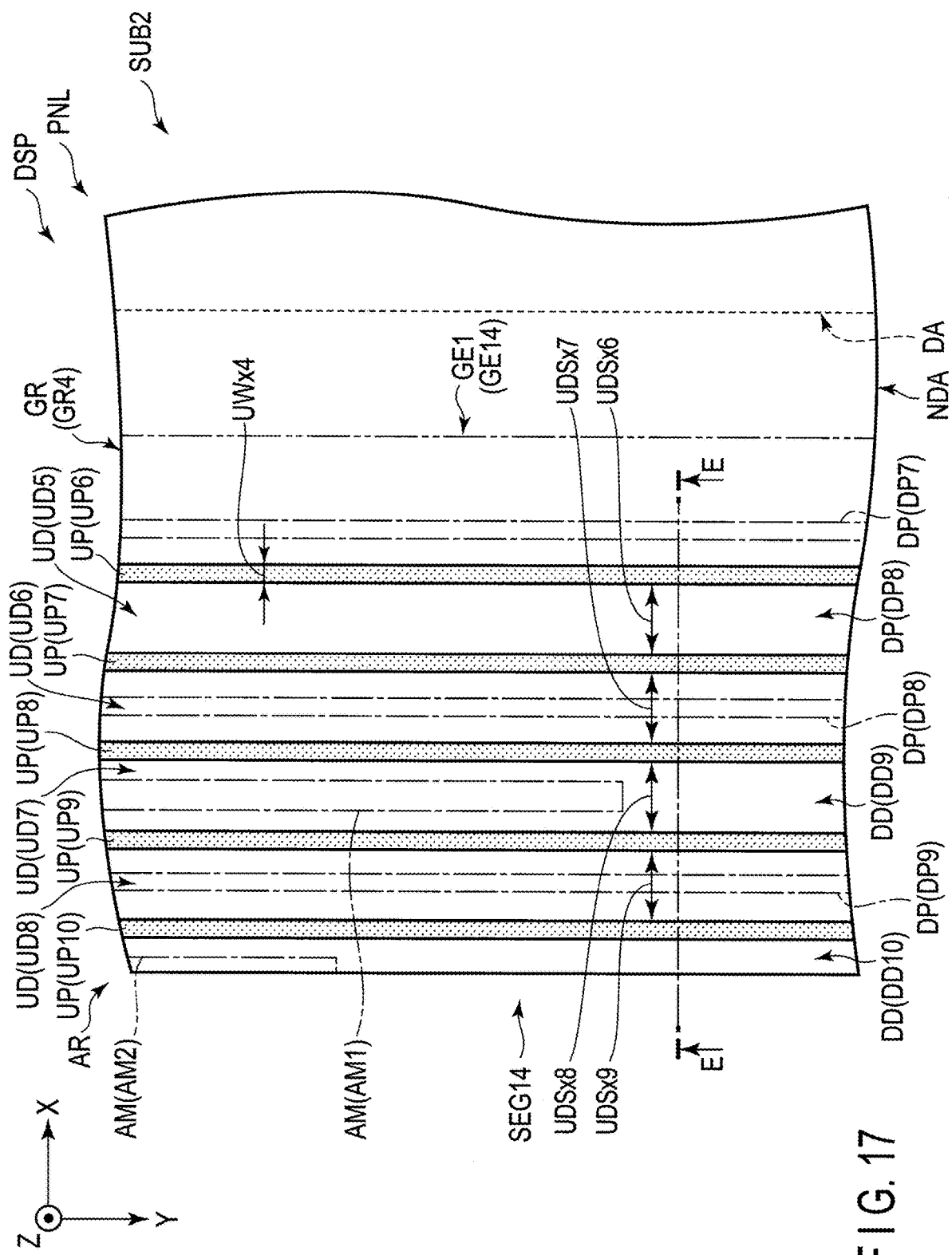
FIG. 17 is a plan view schematically showing a configuration example of a second substrate according to modification 2 of the first embodiment.

FIG. 17 is a plan view schematically showing an example of the configuration of a second substrate SUB2 according to modification 2 of the first embodiment. The second substrate SUB2 shown in FIG. 17 corresponds to the second substrate SUB2 of the area AR shown in FIGS. 1 to 3. FIG. 17 shows only the configuration necessary for description. In FIG. 17, the main portions of the first substrate SUB1 shown in FIG. 16 are indicated by one-dot-one-dash lines, two-dot-one-dash lines and the like.

The second substrate SUB2 includes a plurality of convex portions UP (UP6, UP7, UP8, UP9, UP10, . . . ) and a plurality of concave portions ED (UD5, UD6, UD7, UD8, . . . ).

In the example illustrated in FIG. 17, the convex portions UP6 to UP10 are arranged at intervals in the first direction X and extend in the second direction Y. The horizontal width UWx4 of the convex portions UP6 to UP10 is, for example, 7 μm or less. The horizontal width UWx4 may be larger than 7 μm. The convex portions UP6 and UP7 are superposed on the concave portion DD8. In the first direction X, the convex portion UP7 is separated by a distance UDSx6 from the convex portion UP6 toward the substrate edge. The distance UDSx6 is, for example, 10 μm to 15 μm. The convex portion UP6 may be superposed on the convex portion DP7. The convex portion UP7 may be superposed on the convex portion DP8. In the first direction X, the convex portion UP5 is separated by a distance UDSx7 from the convex portion UP7 toward the substrate edge. The distance UDSx7 is, for example, 20 μm to 25 μm. The convex portions UP5 and UP9 are superposed on the concave portion DD9. Further, neither of the convex portions UP5 and UP9 is superposed on the metal line AM1. In the first direction X, the convex portion UP9 is separated by a distance UDSx3 from the convex portion UP5 toward the substrate edge. The distance UDSx8 is 10 μm to 15 μm. The convex portion UP8 may be superposed on the convex portion DP8 or the metal line AM1. The convex portion UP9 may be superposed on the convex portion DP9 or the metal line AM1. In the first direction X, the convex portion UP10 is separated by a distance UDSx9 from the convex portion UP9 toward the substrate edge. The distance UDSx9 is, for example, 20 μm to 25 μm. The convex portion UP10 is superposed on the concave portion DD10. The convex portion UP10 may be superposed on the convex portion UP9 or the metal line AM2.

Figure 18:
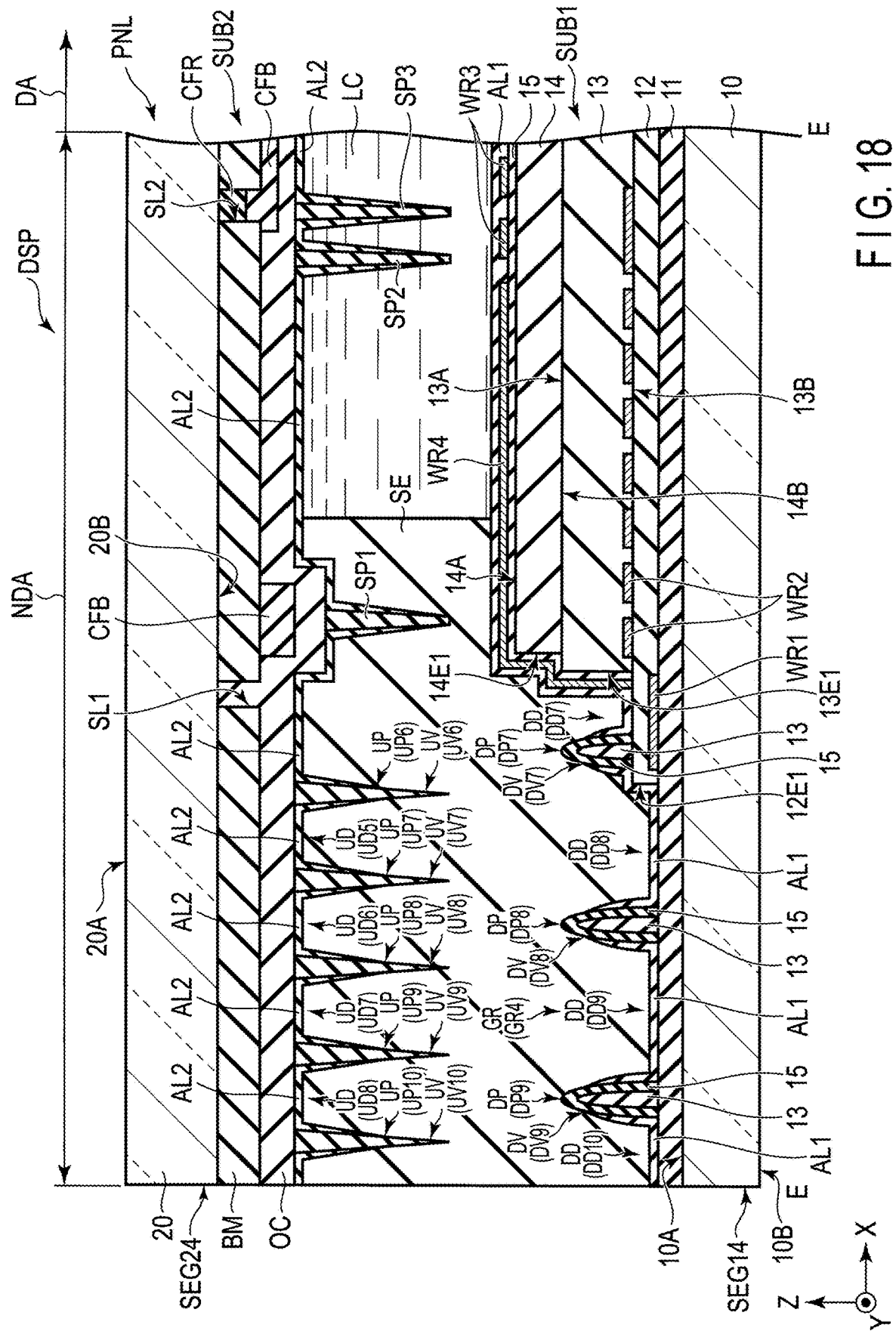
FIG. 18 is a sectional view showing the display panel along line E-E of FIG. 14.

FIG. 18 is a sectional view of the display panel PNL taken along line E-E shown in FIG. 14. FIG. 18 shows the non-display area NDA of the display panel PNL.

In the example shown in FIG. 18, the convex portion DP7 is located on the end portion 12E1. In other words, the convex portion DP7 is located between the sealing member SE and the end portion 12E1. The convex portions DP8 and DP9 are located on the insulating layer 11. In other words, the convex portions DP8 and DP9 are located between the sealing member SE and the insulating layer 11. The convex portion DP7 is located higher than the convex portions DP8 and DP9 in the third direction Z. Note that another layer may be located between the convex portion DP7 and the insulating layer 12. Another layer may be located between the convex portions DP8 and DP9 and the insulating layer 11. The convex portion DP7 need not be located on the end portion 12E1. The convex portion DP7 may be located across the end portion 12E1 and the insulating layer 11. The convex portion DP7 has a top portion DV7. The convex portion DP5 has a top portion DV8. The convex portion DP9 has a top portion DV9. The top portions DV7 to DV9 are exposed from the alignment film AL1 and bonded to the sealing member SE. At least one of the top portions DV7 to DV9 has only to be bonded to the sealing member SE. The alignment film AL1 is formed in the concave portions DD7 to DD10. In the concave portions DD7 to DD10, another layer may be formed between the insulating layer 11 and the alignment film AL1.

In the example shown in FIG. 18, the convex portions UP6 to UP10 are located below the overcoat layer OC and protrude toward the first substrate SUB1. The convex portions UP6 to UP10 are located on the same layer as the spacers SP1 to SP3. Note that another layer may be formed between the convex portions UP6 to UP10 and the overcoat layer OC. The convex portion UP6 has a top portion UV6. The convex portion UP7 has a top portion UV7. The convex portion UP5 has a top portion UV8. The convex portion UP5 has a top portion UV9. The convex portion UP10 has a top portion UV10. The top portions UV6 to UV10 are exposed from the alignment film AL2 and bonded to the sealing member SE. At least one of the top portions UV6 to UV10 has only to be bonded to the sealing member SE. An alignment film AL2 is formed in the concave portions UD5 to UD8. In the concave portions UD5 to UD8, another layer may be formed between the overcoat layer OC and the alignment film AL2.

The foregoing modification 2 can bring about the same advantages as those of the first embodiment.

The display device DSP according to modification 3 of the first embodiment differs from the display device DSP according to the first embodiment in the configuration of the first substrate SUB1.

Figure 19:
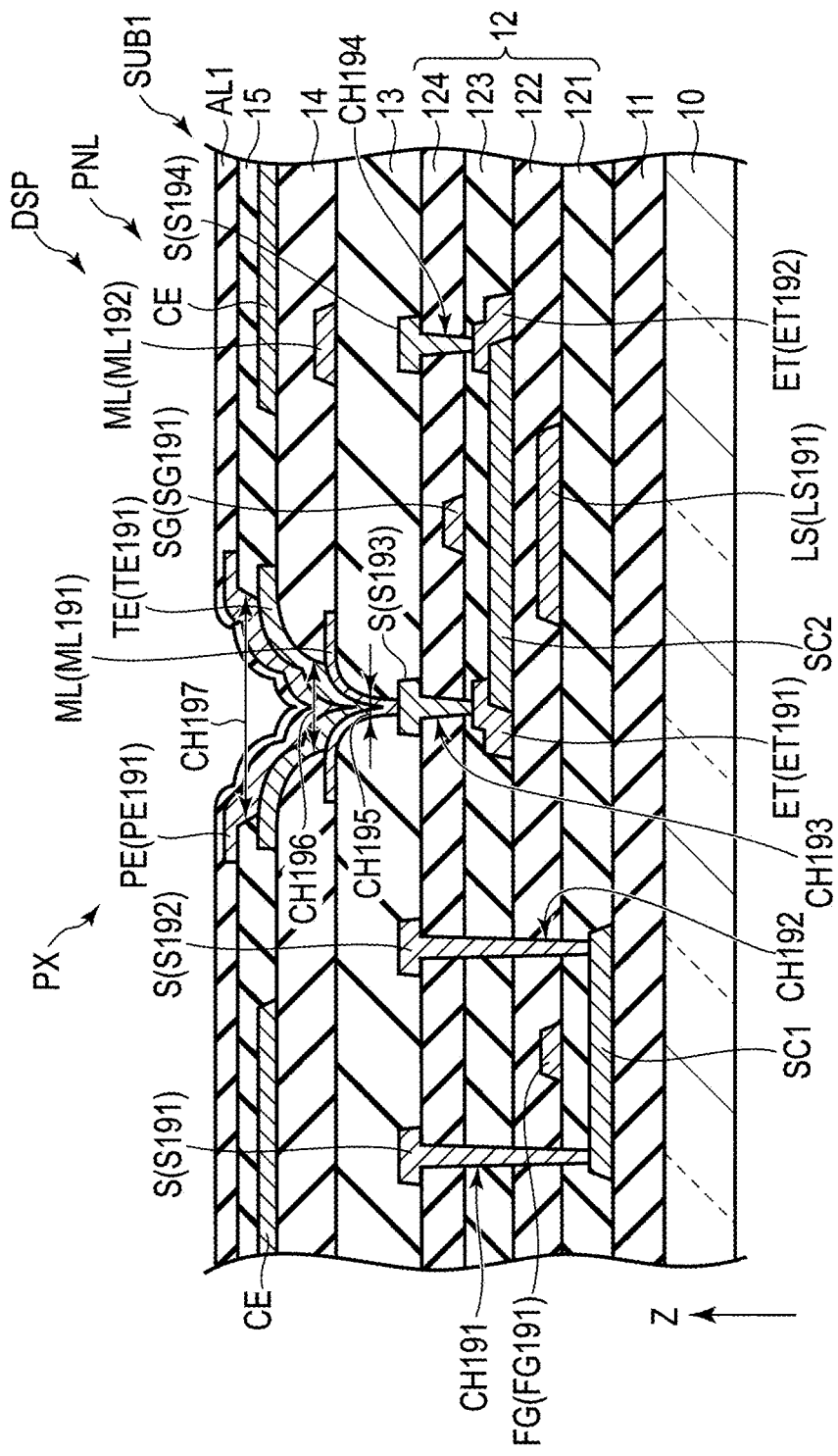
FIG. 19 is a sectional view showing a configuration example of part of a first substrate of the display panel shown in FIGS. 1 through 3.

FIG. 19 is a sectional view showing a configuration of part of the first substrate SUB1 of the display panel PNL shown in FIGS. 1 to 3.

The first substrate SUB1 further includes a semiconductor layer SC1, a scanning PG (FG191, . . . ), a metal layer LS (LS191, . . . ), a semiconductor layer SC2, an electrode layer ET (ET191, 192, . . . ), a scanning line SG (SG191, . . . ), a transparent electrode TE (TE191, . . . ), and the like.

The insulating layer 12 includes an insulating layer 121, an insulating layer 122 formed on the insulating layer 121, an insulating layer 123 formed on the insulating layer 122, and an insulating layer 124 formed on the insulating layer 123. The insulating layers 121 to 124 are inorganic insulating layers formed of an inorganic insulating material such as silicon oxide, silicon nitride and silicon oxynitride. The insulating layers 121 to 124 may have a single-layer structure or a multilayer structure.

The semiconductor layer SC1 is located between the insulating layers 11 and 121. The semiconductor layer SC1 is, for example, a silicon semiconductor. For example, the semiconductor layer SC1 is formed of polycrystalline silicon (polysilicon). The semiconductor layer SC1 includes a high-resistance region having a high electrical resistance and a low-resistance region whose electrical resistance is lower than that of the high-resistance region. The scanning line FG is located between the insulating layers 121 and 122. The scanning line FG is opposed to the high-resistance region of the semiconductor layer SC1. The metal layer LS is located between the insulating layers 121 and 122. The metal layer LS is opposed to the semiconductor layer SC2. In the example shown in FIG. 19, the metal layer LS191 is located in the same layer as the scanning line FG191 and separated from the scanning line FG191. The semiconductor layer SC2 is located between the insulating layers 122 and 123.

The transistors associated with the semiconductor layer SC1 is excellent in responsiveness and is used as a built-in circuit such as a gate drive circuit.

The semiconductor layer SC2 is, for example, a metal oxide semiconductor. For example, the semiconductor layer SC2 is formed of a metal oxide containing at least one metal selected from indium, gallium, zinc and tin. The electrode layer ET covers an end of the semiconductor layer SC2. The electrode layer ET is formed of a metal material such as titanium (Ti). In the example shown in FIG. 19, the electrode layer ET 191 covers one end of the semiconductor layer SC2, and the electrode layer ET192 covers the other end of the semiconductor layer SC2, which is opposite to the one end covered with the electrode layer ET191. The scanning line SG is located between the insulating layers 123 and 124. The scanning lines FG and SG and the metal layer LS are formed or the same metal material. For example, the scanning lines FG and SG and the metal layer LS are formed of the same material as that of the scanning line G. In the example shown in FIG. 19, the scanning line SG191 is opposed to the semiconductor layer SC2.

The transistors associated with the semiconductor layer SC2 are used for the sub-pixels PX, for example.

The signal line S is located between the insulating layers 124 and 13. In the example shown in FIG. 19, the signal line S191 is connected to one end of the semiconductor layer SC1 via a contact hole CH191 that penetrates the insulating layers 121 to 124. The signal line S192 is connected to the other end of the semiconductor layer SC1, which is opposite to the one end thereof to which the signal line S191 is connected, via a contact hole CH192 that penetrates the insulating layers 121 to 124. The signal line S193 is connected to the electrode layer ET191 via a contact hole CH193 that penetrates the insulating layers 124 and 123. The signal line S194 is connected to the electrode layer ET192 via a contact hole CH194 that penetrates the insulating layers 124 and 123. In the example shown in FIG. 19, the metal line ML191 is connected to the signal line S193 via a contact hole CH195 that penetrates the insulating layer 13. The transparent electrode TE is located on the same layer as the common electrode CE and is formed of the same material as that of the common electrode CE. In the example shown in FIG. 19, the transparent electrode TE191 is located between the insulating layers 14 and 15. The transparent electrode TE191 is connected to the metal line ML191 through a contact hole CH196 that penetrates the insulating layer 14. In the example shown in FIG. 19, the pixel electrode PE191 is connected to the transparent electrode TE191 through a contact hole CH197 that penetrates the insulating layer 15.

The modification 3 described above can bring about the same advantages as those of the first embodiment.

The display device DSP according to the second embodiment differs from the display device DSP according to the first embodiment in the configuration of the display panel.

FIG. 20 is a sectional view showing a configuration of part of the display panel PNL according to the second embodiment. The sectional view of FIG. 20 shows an example of the configuration of a region corresponding to the sub-pixel PX. The example shown in FIG. 20 corresponds to a configuration example to which a display mode using a lateral electric field, for example, a fringe field switching (FFS) mode is applied.

The common electrode CE is located on the insulating layer 13. The metal line ML is in contact with the common electrode CE and is superposed on the signal line S. The insulating layer 15 is located on the common electrode CE and the metal line ML. In the example shown in FIG. 20, the insulating layer 15 covers the common electrode CE and the metal line ML.

Figure 21:
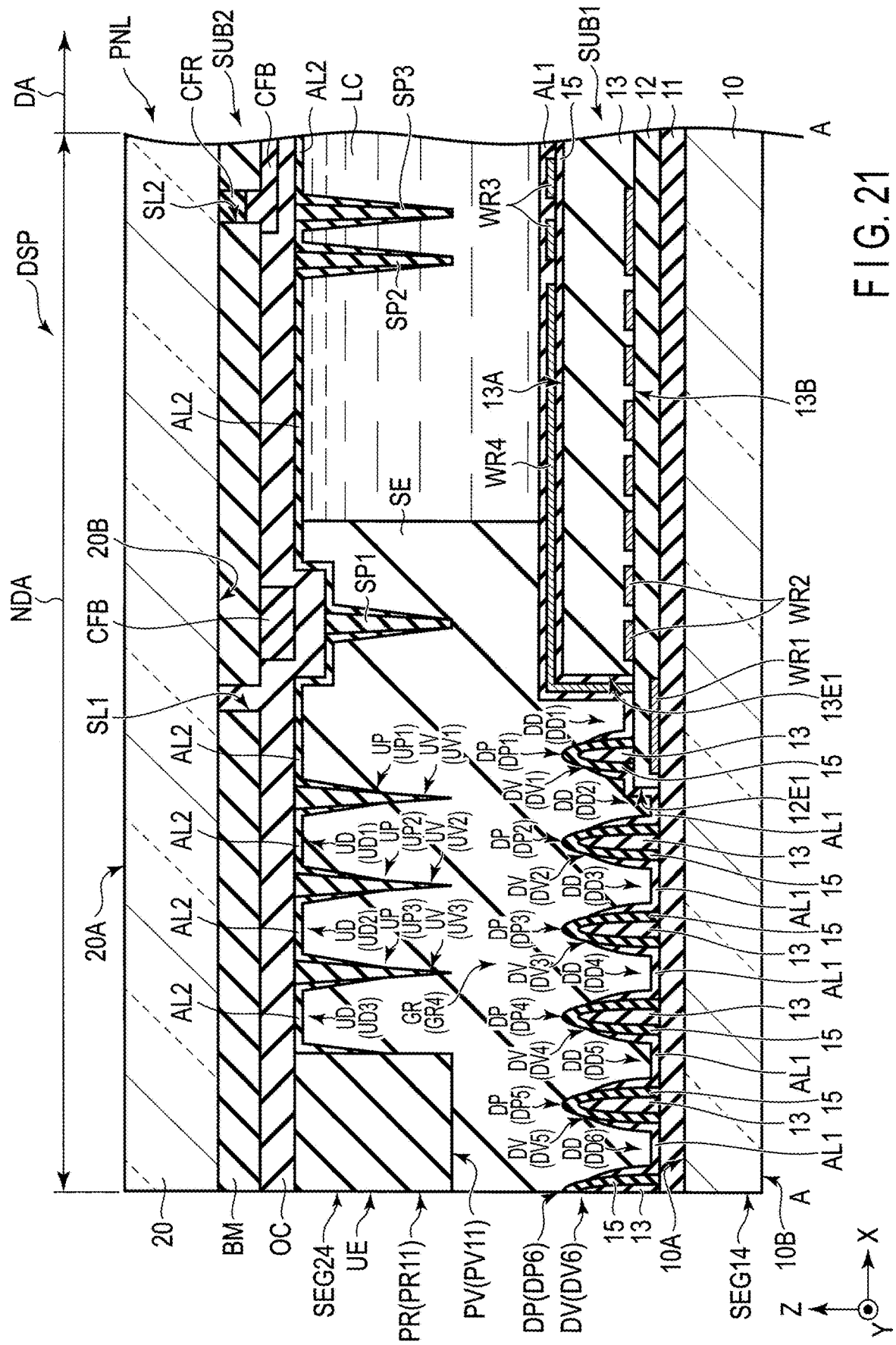
FIG. 21 is a sectional view of the display panel according to the second embodiment.

FIG. 21 is a sectional view of the display panel PNL according to the second embodiment. FIG. 21 corresponds to the sectional view of the display panel PNL of the second embodiment taken along line A-A shown in FIG. 9. FIG. 21 shows a non-display area NDA of the display panel PNL.

In the example shown in FIG. 21, the groove portion GR4 is located between the end portion 13E1 of the insulating layer 13 and the substrate edge SEG14. The insulating layer 15 extends from the top of the insulating layer 13 to the side surface of the end portion 13E1. The peripheral line WR4 extends from the top of the insulating layer 13 to the side of the end portion 13E1 along the insulating layer 15. The alignment film AL1 extends from the top of the peripheral line WR4 to the groove portion GR4 through the end portion 13E1.

The second embodiment described above can bring about the same advantages as those of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, the display device DSP can be configured such that the same pattern as that of the convex and concave portions in the non play area NDA formed of the same material as that of the spacer SP in the second substrate SUB2 is formed using at least one of the insulating layers 13 and 14 in the first substrate SUB1, as described in the foregoing embodiments and modifications. The display device DSP can also be configured such that the same pattern as that of the convex and concave portions in the non-display area NDA formed in the insulating layer 13 in the first substrate SUB1 is formed using the same material as that of the spacer SP in the second substrate SUB2. The accompanying claims and their equivalents are intended to cover such forms or modifications as would fall within the scope and spirit of the inventions.

What is claimed is:

1. A substrate comprising:
a light-shielding layer;
a color filter;
an overcoat layer covering the color filter;
an alignment film; and
a plurality of convex portions formed on the overcoat layer, wherein
an outer shape of the substrate has at least a long side edge and a short side edge,
the short side edge is parallel to a first direction,
the long side edge is parallel to a second direction intersecting the first direction,
the plurality of convex portions have a first convex portion and a second convex portion,
the first convex portion and the second convex portion are located near the long side edge,
the first convex portion extends in the first direction,
the second convex portion is aligned with the first convex portion in the second direction and extends in the first direction,
the first convex portion and the second convex portion are connected to each other via a connection portion on the overcoat layer,
a top portion of the first convex portion is exposed from the alignment film, and
the alignment film is in contact with the connection portion.

2. The substrate of claim 1, wherein
a concave portion is formed by the first convex portion, the second convex portion and the connection portion, and
a depth of the concave portion is greater than a thickness of the connection portion.

3. The substrate of claim 1, wherein,
the first convex portion has a long axis along the first direction and a short axis along the second direction, and
the second convex portion has a long axis along the first direction and a short axis along the second direction.

4. The substrate of claim 1, wherein
the light-shielding layer has a first slit between the long side edge and a display area, and
the first convex portion and the second convex portion are located between the long side edge and the first slit.

5. The substrate of claim 4, wherein the first convex portion and the second convex portion do not overlap the color filter.

6. The substrate of claim 1, wherein the plurality of convex portions have a third convex portion extending in the second direction.

7. The substrate of claim 6, wherein,
the first convex portion has a long axis along the first direction and a short axis along the second direction,
the second convex portion has a long axis along the first direction and a short axis along the second direction
in the first direction, the first convex portion has a first end and a second end opposed to the first end,
in the first direction, the second convex portion has a third end and a fourth end opposed to the third end,
the first end and the third end are on a side of the long side edge,
the second end is in contact with the third convex portion, and
the third end is in contact with the third convex portion.

8. The substrate of claim 6, wherein,
the first convex portion has a long axis along the first direction and a short axis along the second direction,
the second convex portion has a long axis along the first direction and a short axis along the second direction, and
the first convex portion and the second convex portion are located between the third convex portion and the long side edge.

9. The substrate of claim 8, wherein
in the first direction, the first convex portion has a first end and a second end opposed to the first end,
in the first direction, the second convex portion has a third end and a fourth end opposed to the third end,
the first end is located closer to the long side edge than the second side is,
in the first direction, the second end faces the third convex portion,
the third end is located closer to the long side edge than the fourth end is, and
in the first direction, the fourth end faces the third convex portion.

10. The substrate of claim 9, wherein
the second end is in contact with the third convex portion, and
the fourth end is in contact with the third convex portion.

* * * * *